(12) United States Patent
Takashima

(10) Patent No.: US 8,559,223 B2
(45) Date of Patent: Oct. 15, 2013

(54) FUSION MEMORY

(75) Inventor: Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 13/049,504

(22) Filed: Mar. 16, 2011

(65) Prior Publication Data
US 2011/0228603 A1    Sep. 22, 2011

(30) Foreign Application Priority Data

Mar. 19, 2010 (JP) .................. 2010-064748
Aug. 6, 2010 (JP) .................. 2010-178090
Jan. 7, 2011 (JP) .................. 2011-002029

(51) Int. Cl.
*G11C 11/40* (2006.01)

(52) U.S. Cl.
USPC .................. 365/185.05; 365/184

(58) Field of Classification Search
USPC ............................ 365/185.08, 184
See application file for complete search history.

(56) References Cited

U.S. PATENT DOCUMENTS

2009/0235015 A1* 9/2009 Hatsuda et al. ............... 711/103
2010/0161881 A1* 6/2010 Nagadomi et al. ............ 711/103

FOREIGN PATENT DOCUMENTS

JP    2007-129040    5/2007

OTHER PUBLICATIONS

John Barth et al., "A 45nm SOI Embedded DRAM Macro for POWER7™ 32MB On-Chip L3 Cache," IEEE International Solid-State Circuits Conference, Session 19, High Performance Embedded Memory, 19.1, 2010, 3 pages.
Dinesh Somasekhar et al., "2GHz 2Mb 2T Gain-Cell Memory Macro with 128GB/s Bandwidth in a 65mm Logic Process," IEEE International Solid-State Circuits Conference, Session 14, Embedded & Graphics DRAMs, 14.3, 2008, 3 pages.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, there is provided a fusion memory including a first memory cell array formed of a NAND cell unit and a second memory cell array formed of a DRAM cell on a semiconductor substrate. The NAND cell unit is formed of a non-volatile memory cell having a two-layer gate structure in which a first gate and a second gate are stacked, and a selective transistor connecting the first and second gates of the non-volatile memory cell. The DRAM cell is formed of a cell transistor having a structure same as the structure of the selective transistor, and a MOS capacitor having a structure same as the structure of the non-volatile memory cell or the selective transistor.

26 Claims, 32 Drawing Sheets

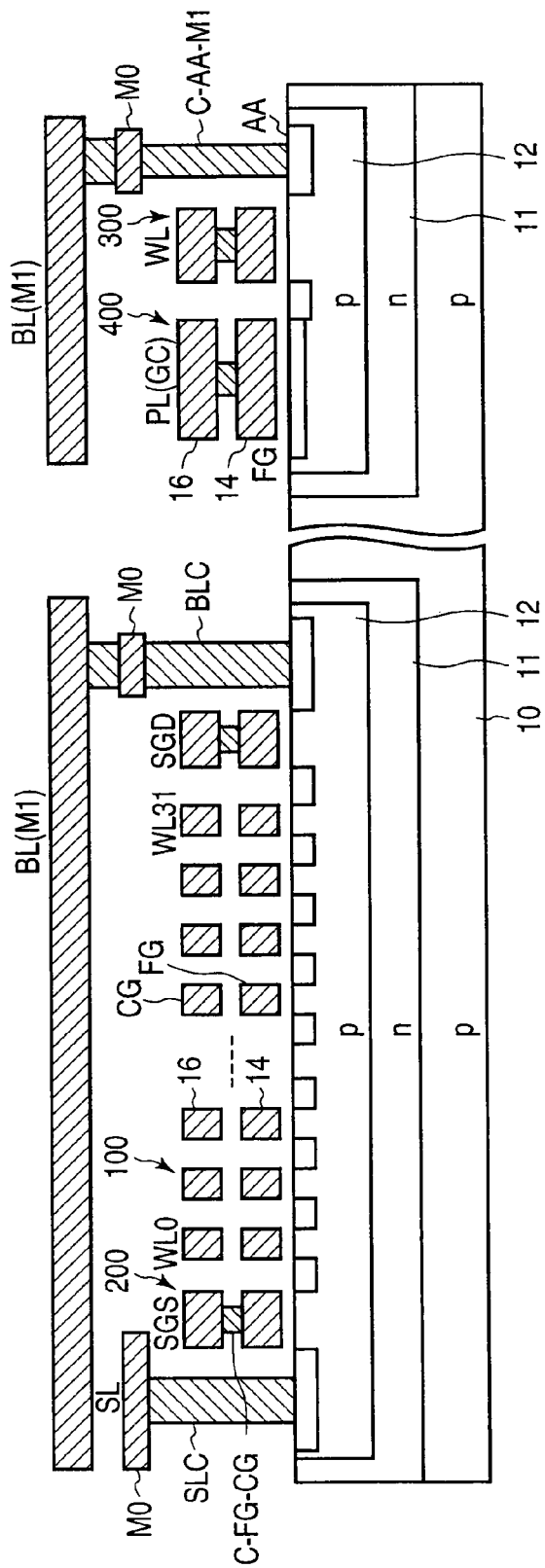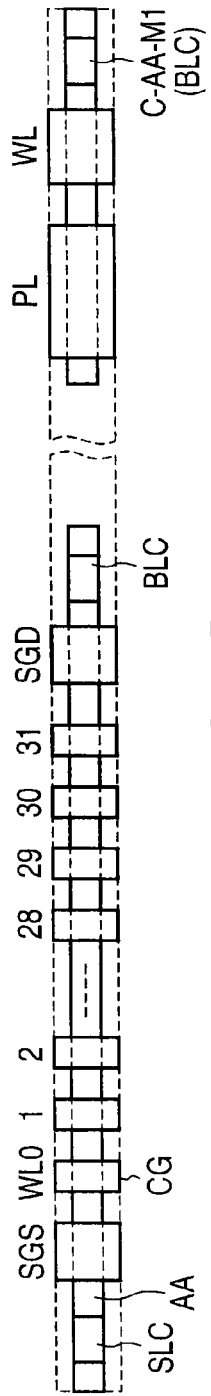
FIG. 1A
FIG. 1B

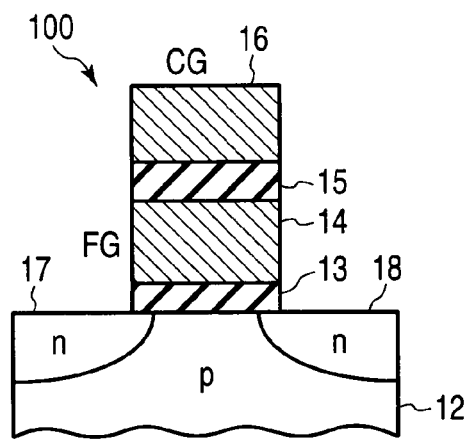
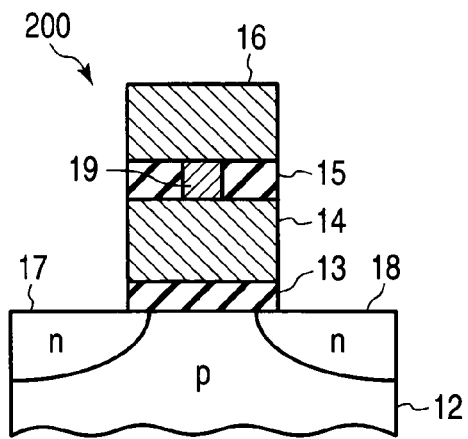
FIG. 2A    FIG. 2B
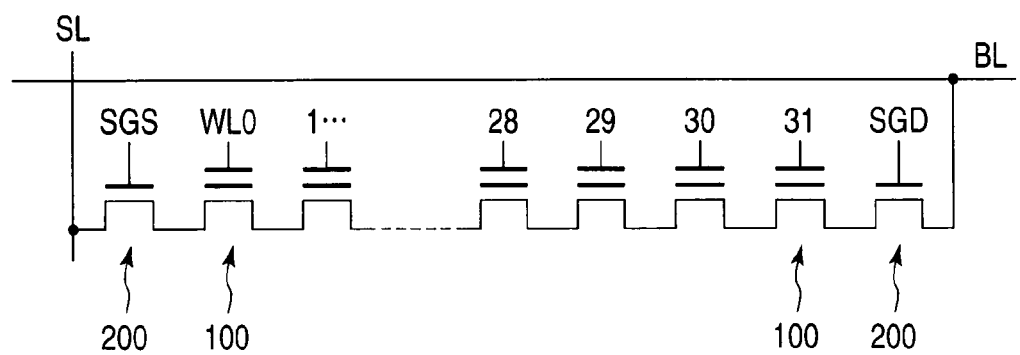
FIG. 3

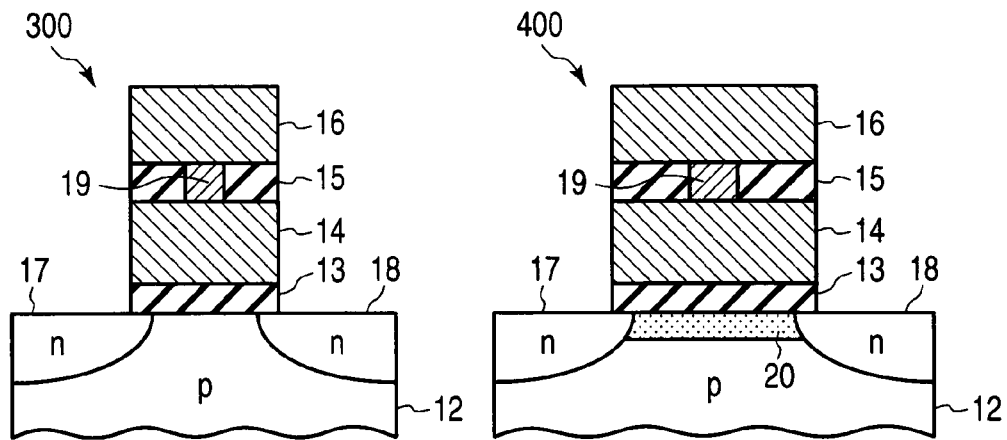
F I G. 4 A            F I G. 4 B
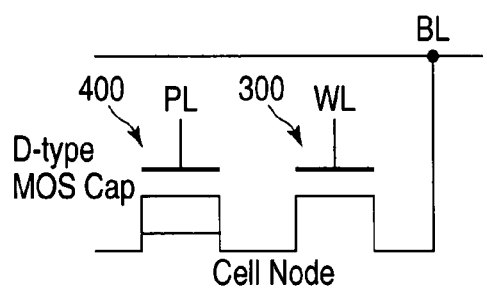
F I G. 5 A
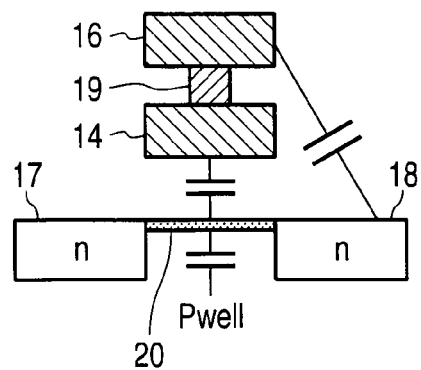
F I G. 5 B

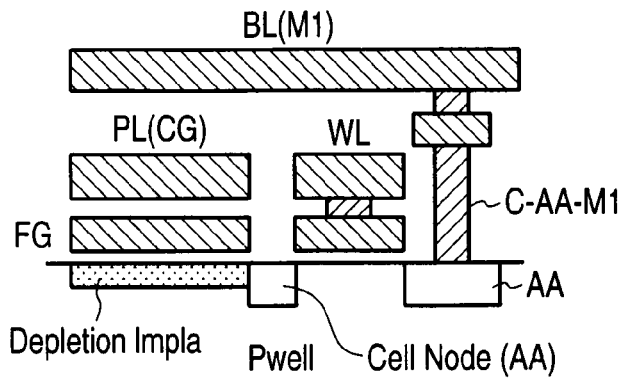
F I G. 6
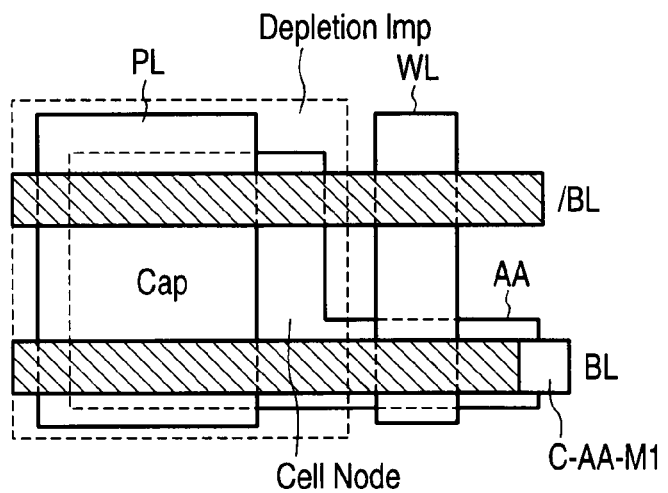
F I G. 7A
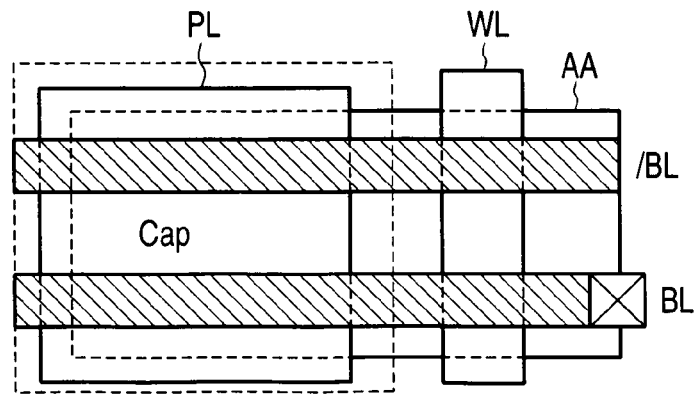
F I G. 7B

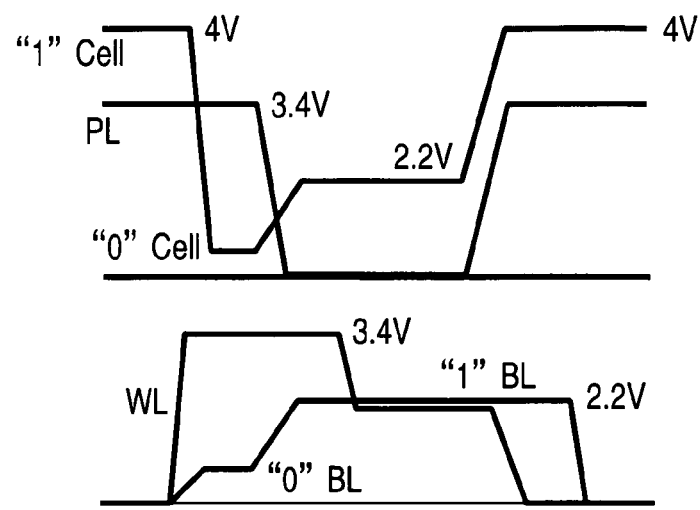
F I G. 8 A
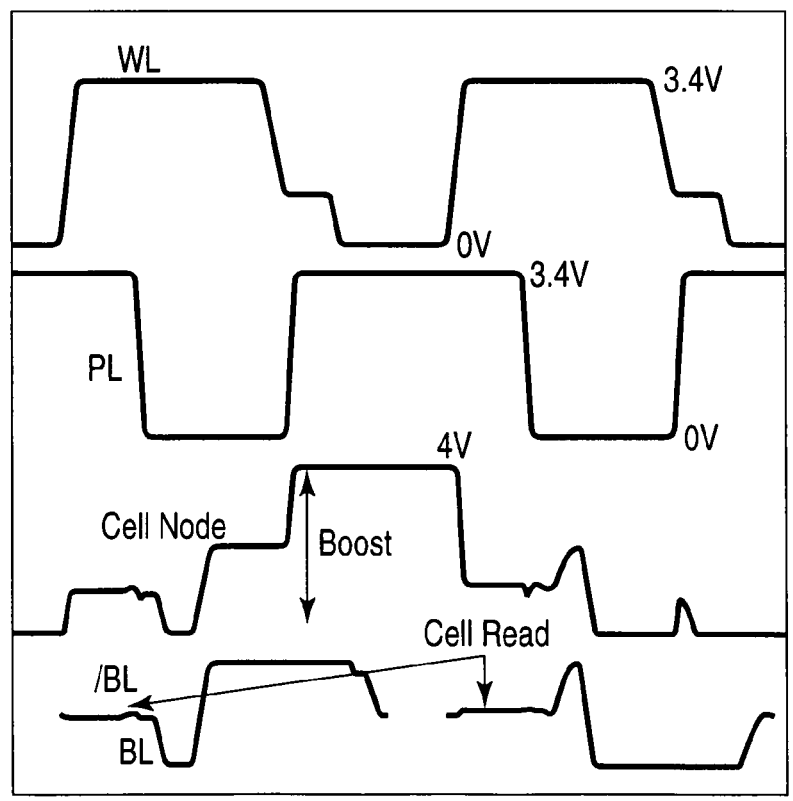
F I G. 8 B

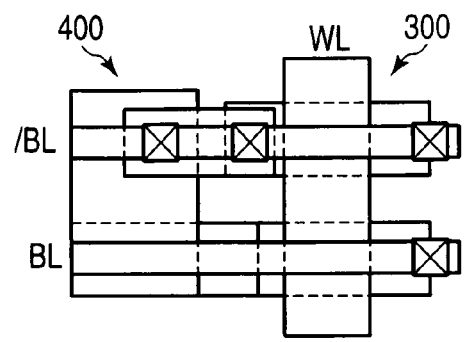
F I G. 1 5 A
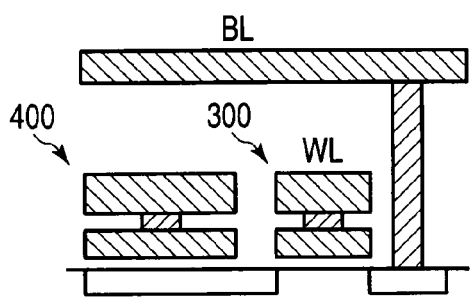
F I G. 1 5 B
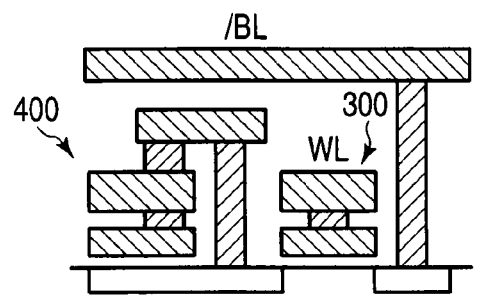
F I G. 1 5 C
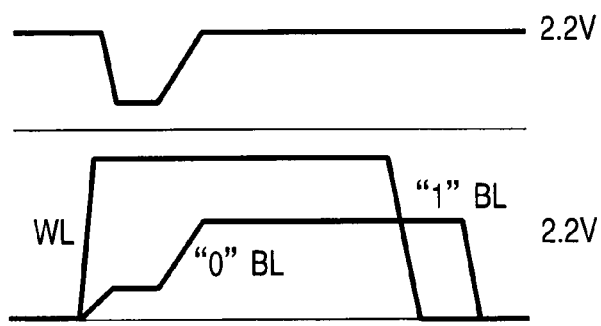
F I G. 1 6 A
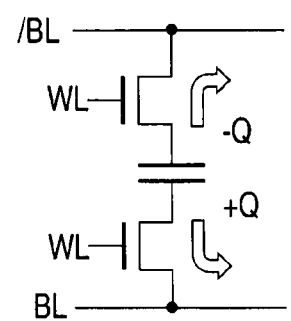
F I G. 1 6 B

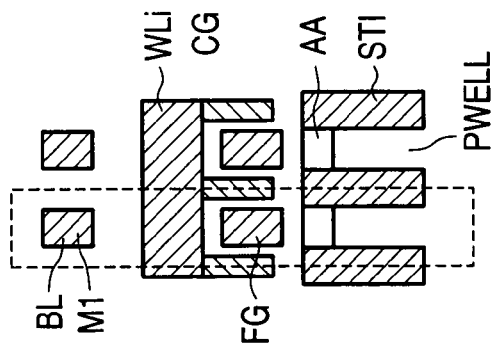
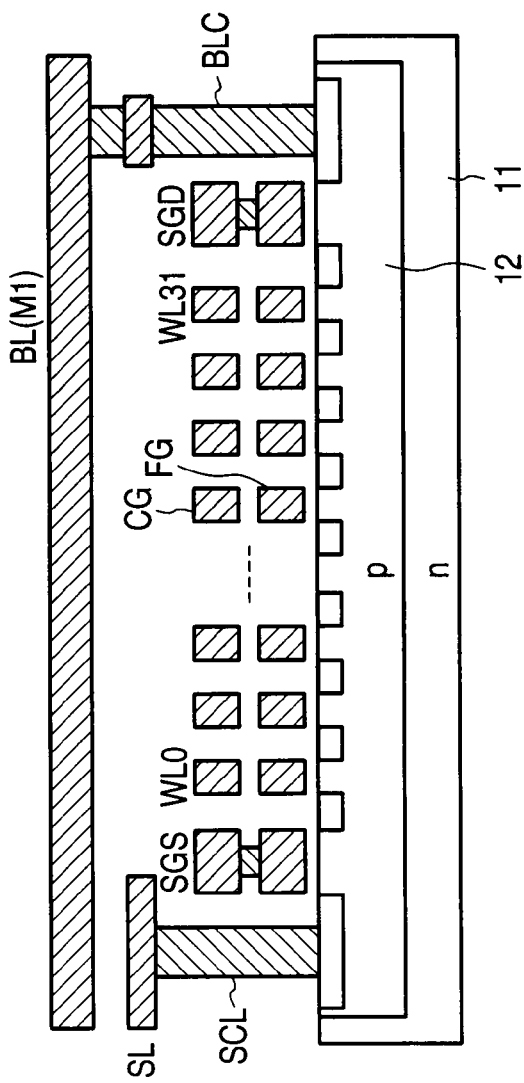
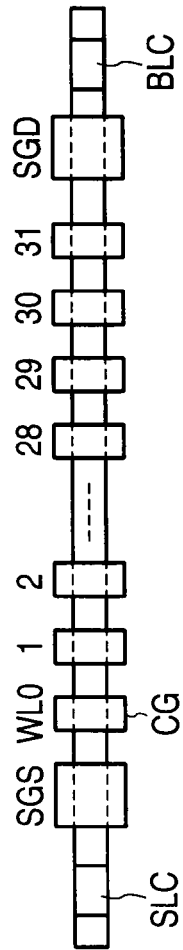

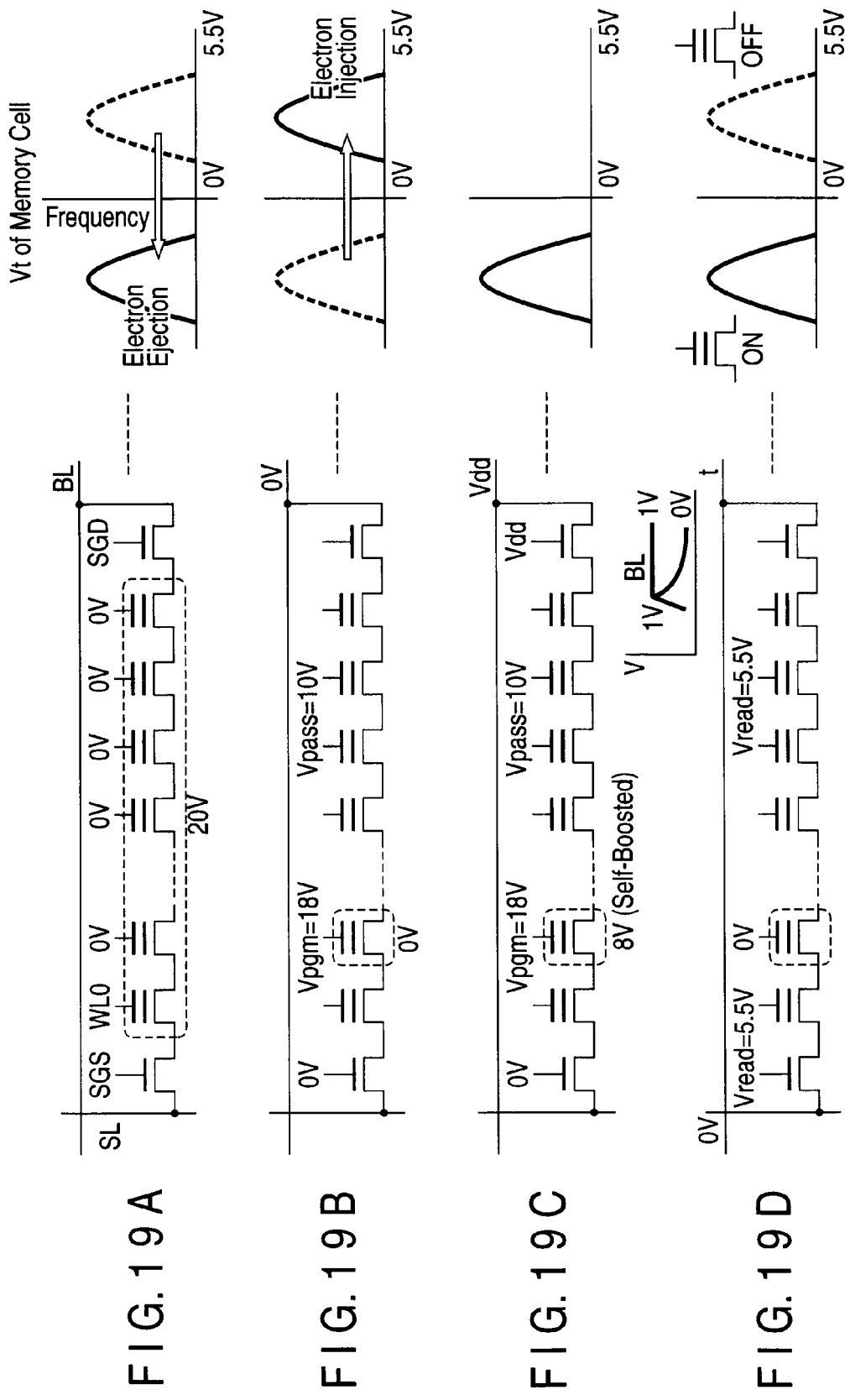
F I G. 19 A
F I G. 19 B
F I G. 19 C
F I G. 19 D

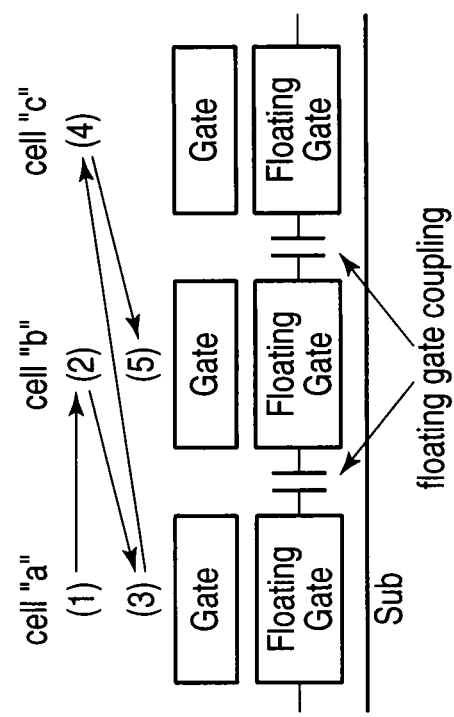
F I G. 20 A
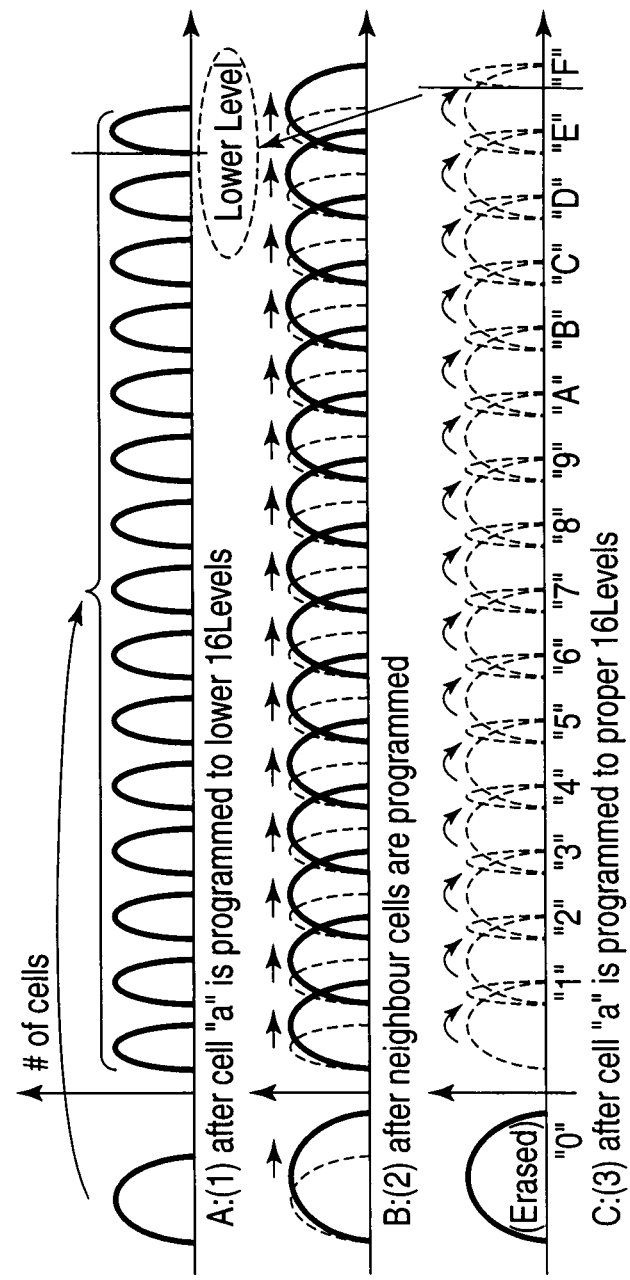
F I G. 20 B

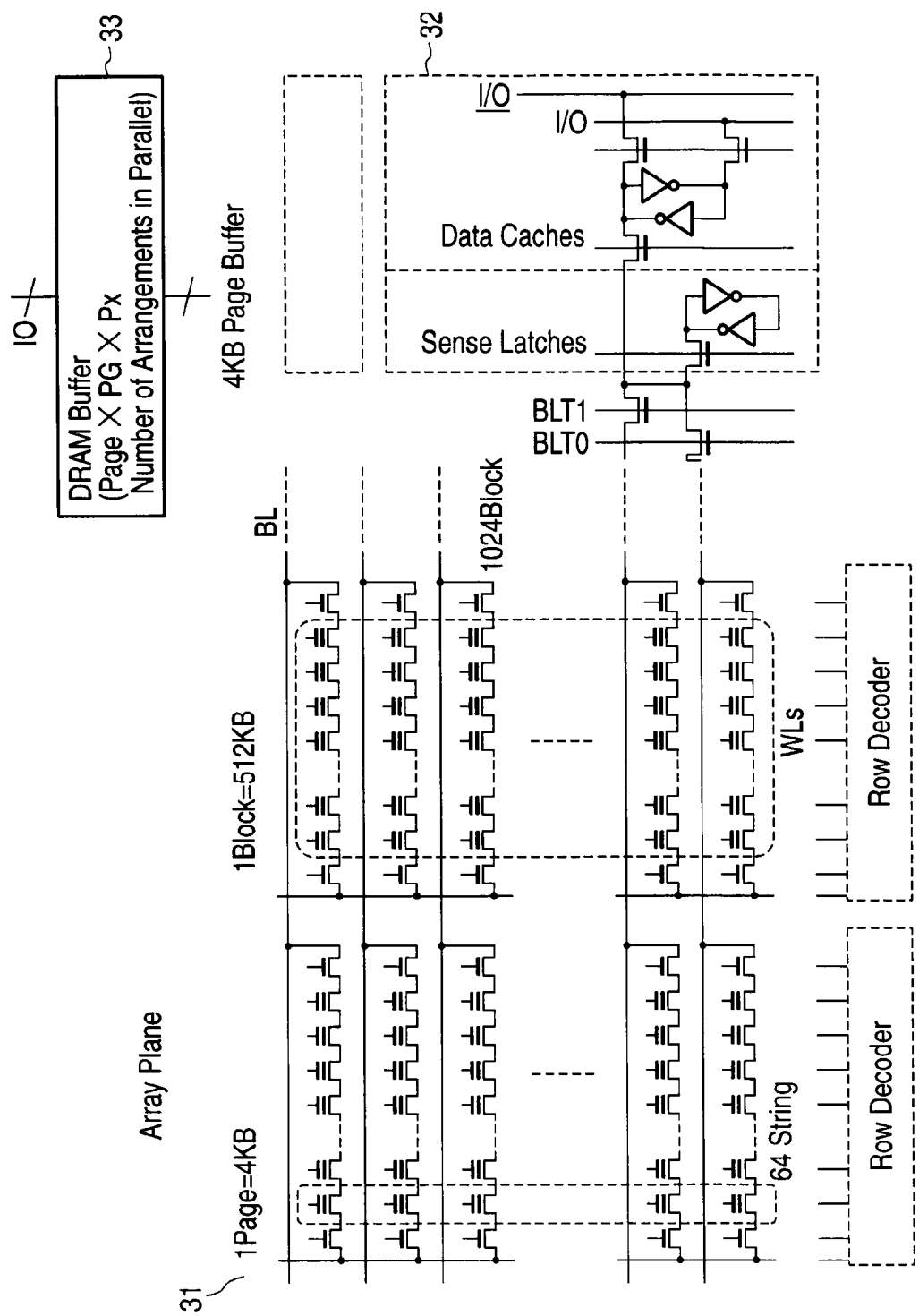
F I G. 21

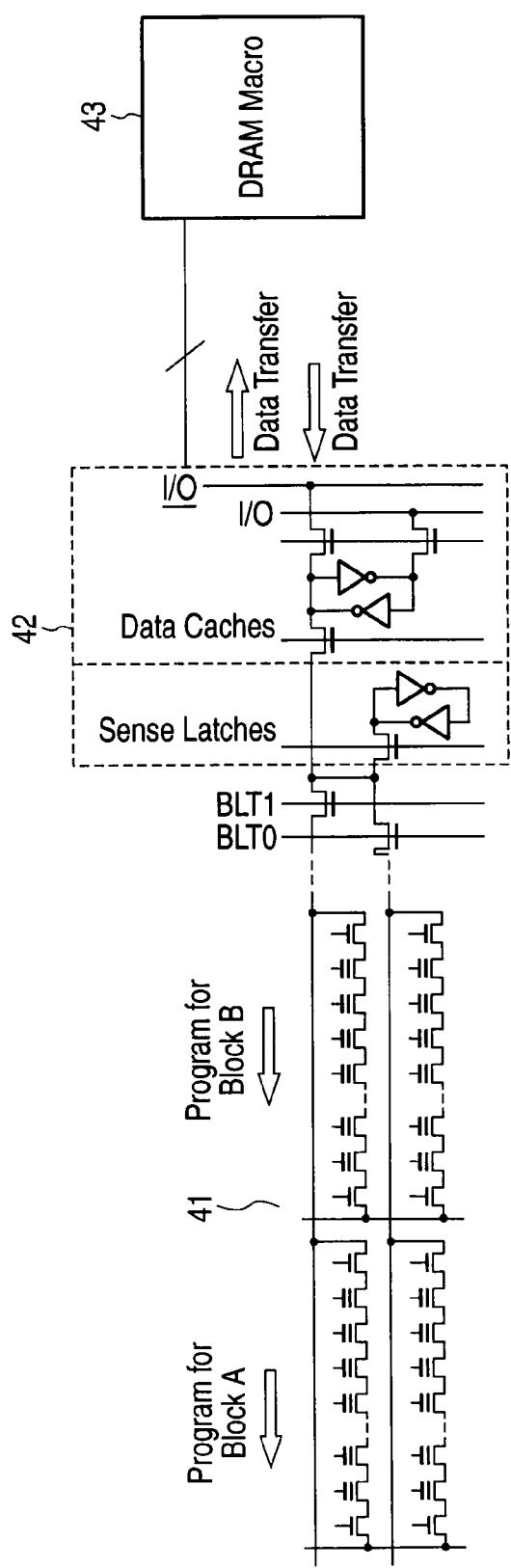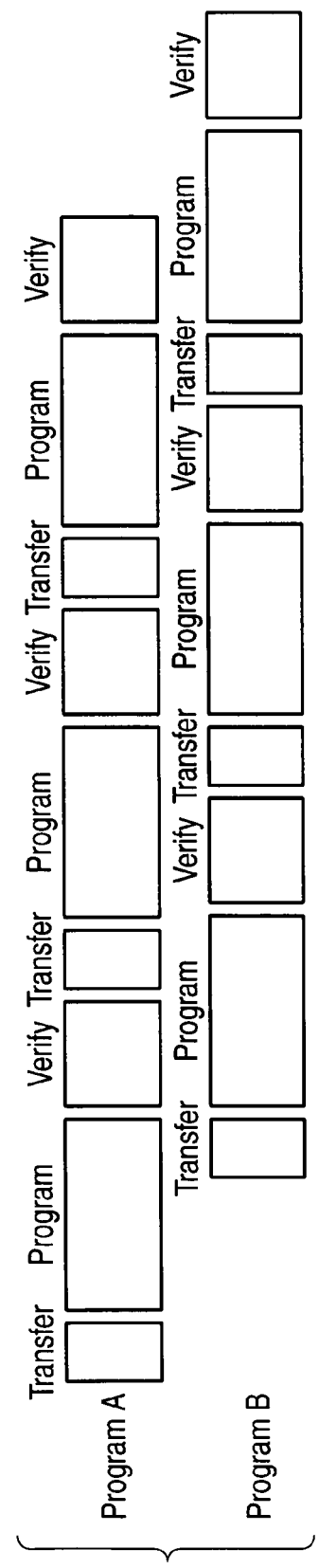
FIG. 22A
FIG. 22B

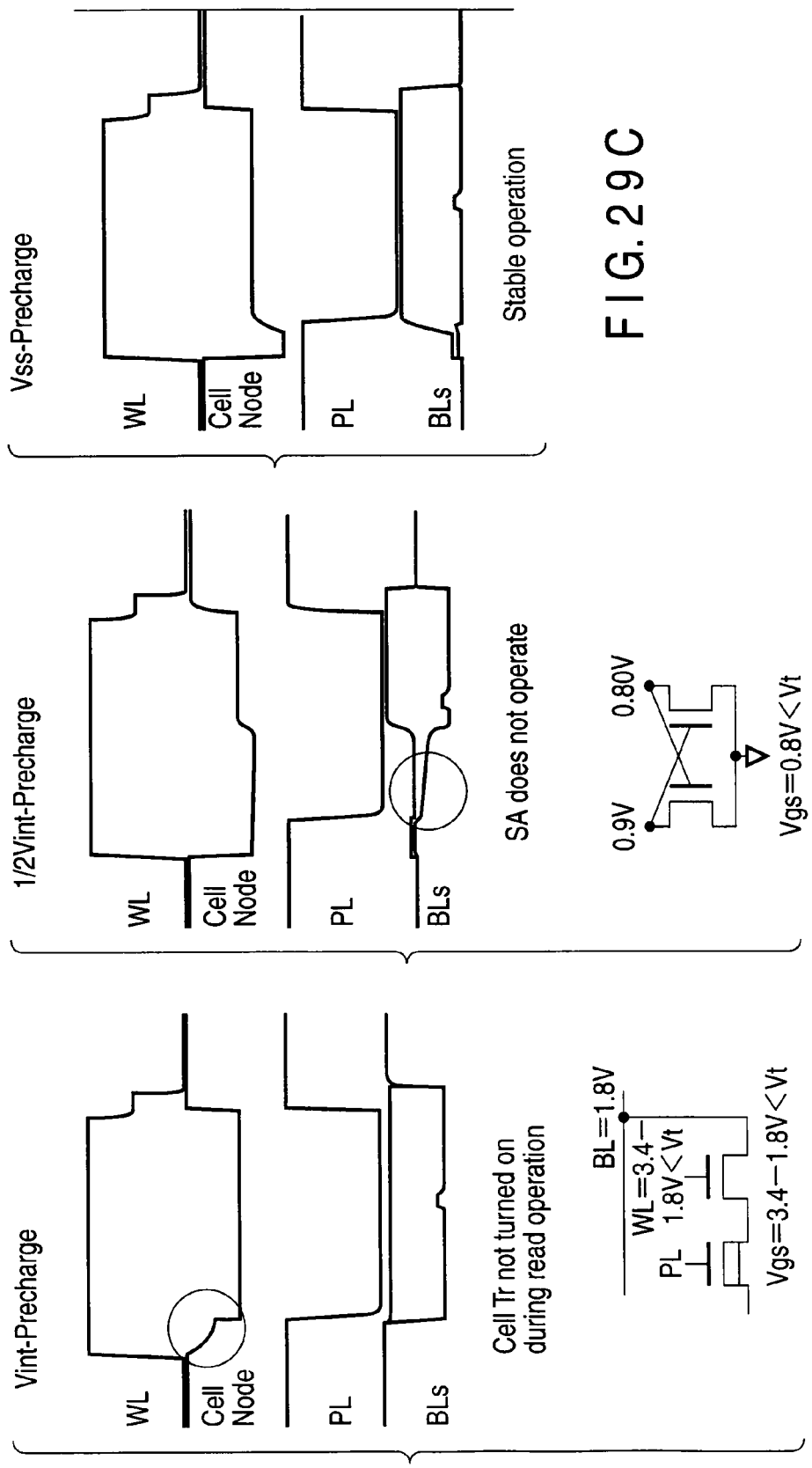

FUSION MEMORY

CROSS-REFERENCE TO RELATED APPLICATIONS

This application is based upon and claims the benefit of priority from Japanese Patent Applications No. 2010-064748, filed Mar. 19, 2010; No. 2010-178090, filed Aug. 6, 2010; and No. 2011-002029, filed Jan. 7, 2011; the entire contents of all of which are incorporated herein by reference.

FIELD

Embodiments described herein relate generally to a fusion memory which combines a NAND flash memory with a DRAM.

BACKGROUND

The main types of electrically rewritable non-volatile memories include NOR and NAND types. Compared to NOR flash memory, NAND flash memory has a slow access speed, a slow write-program speed, and a long blanking time. NAND flash memory, however, is capable of reading data in burst mode, has wide effective bandwidths, and is capable of programming and erasing a number of bits at once. Further, since write data is fetched in burst mode and a number of bits can be programmed at once, NAND flash memory has wide effective bandwidths. These features explain the popularity of NAND flash memory in various applications including memory cards and USB memories. In recent years, NAND flash memory has gained application in mobile phone memories. If NAND flash memories with hundreds of bytes became available, they could be used as an alternative to HDDs used in PCs.

A non-volatile memory as represented by NAND flash memory requires a write time as long as 200 μs and a read time as long as 50 μs. Accordingly, a page buffer capable of providing high-speed operation for temporal data storage needs to be provided. Currently available NAND flash memories lack capacitor elements of types that have a large capacitance per unit area, such as trench type and stacked type, which are necessary with the conventional DRAM. Accordingly, DRAM cell cannot be manufactured without making a significant change to the manufacturing process.

For the reasons stated above, SRAM cells are used as page buffer of NAND flash memories because of the large cell area. Accordingly, increase in capacitance of the page buffer in the interest of improving performance of the NAND flash memory will greatly increase the area of the chip. Further, usage of a DRAM cell instead of the SRAM cell as a high-speed buffer would require a significant change in manufacturing process. This results in a significant increase in manufacturing cost.

BRIEF DESCRIPTION OF THE DRAWINGS

FIGS. 1A and 1B are a cross-sectional view and a plan view, respectively, illustrating an element configuration of a fusion memory according to the first embodiment;

FIGS. 2A and 2B are cross-sectional views illustrating an element configuration of a non-volatile memory cell and a selective transistor used in the fusion memory of the first embodiment;

FIG. 3 is an equivalent circuit diagram illustrating a circuit configuration of a NAND cell unit using the non-volatile memory cell and the selective transistor of FIG. 2;

FIGS. 4A and 4B are cross-sectional views illustrating an element configuration of a cell transistor and a MOS capacitor used in the fusion memory of the first embodiment;

FIGS. 5A and 5B are equivalent circuit diagrams illustrating a circuit configuration of a DRAM cell using a cell transistor and a MOS capacitor of FIG. 4;

FIG. 6 is a cross-sectional view illustrating another element configuration example of the DRAM cell used in the fusion memory of the first embodiment;

FIGS. 7A and 7B are plan views illustrating an element configuration of the DRAM cell using a cell transistor and a MOS capacitor of FIG. 4;

FIGS. 8A and 8B are timing charts illustrating operations of the DRAM cell of FIGS. 5A and 5B;

FIGS. 15A, 15B and 15C are plan and cross-sectional views illustrating a configuration of a DRAM cell used in the fifth embodiment;

FIGS. 16A and 16B illustrate the operation of a DRAM cell used in the fifth embodiment;

FIGS. 18A, 18B and 18C are cross-sectional and plan views illustrating an element configuration of the DRAM used in the sixth embodiment;

FIGS. 19A, 19B, 19C and 19D illustrate a flash memory operation of the DRAM cell of FIGS. 18A, 18B and 18C;

FIGS. 20A and 20B illustrate a problem of the conventional NAND flash memory;

FIG. 21 illustrates a configuration of a fusion memory according to the seventh embodiment;

FIGS. 22A and 22B are a circuit diagram and a timing chart illustrating a fusion memory according to the eighth embodiment;

FIGS. 29A, 29B and 29C are timing charts illustrating an operation of a DRAM cell used in the fifteenth embodiment;

DETAILED DESCRIPTION

Figure 9:
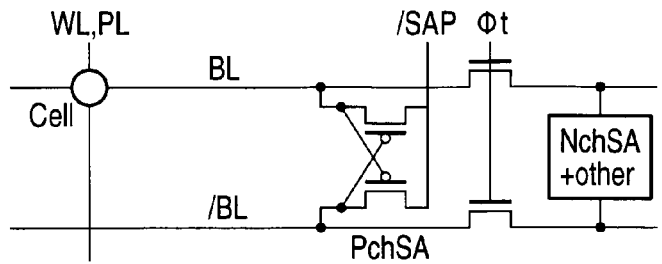
FIG. 9 is a circuit configuration diagram illustrating a configuration of a sense amplifier used in the fusion memory of the first embodiment.

In general, according to one embodiment, there is provided a fusion memory comprising a first memory cell array and a second memory cell array mounted on a semiconductor substrate, the first memory cell array being formed of a NAND cell unit and the second memory cell array being formed of a DRAM cell. The NAND cell unit is formed of a non-volatile memory cell having a two-layer gate configuration in which a first gate and a second gate are stacked, and a selective transistor in which the first and second gates of the non-volatile memory cell are electrically connected. The DRAM cell is formed of a cell transistor having a configuration same as that of a selective transistor, and a MOS capacitor having a configuration same as that of the non-volatile memory cell or the selective transistor.

Hereinafter, embodiments will be described with reference to the accompanying drawings.

First Embodiment

FIGS. 1A and 1B are a cross-sectional view and a plan view, respectively, illustrating an element configuration of a fusion memory according to a first embodiment.

An n-type well 11 is formed on part of a p-type semiconductor substrate 10, and a p-type well 12 is formed in the n-type well 11. On a top surface of the p-type well 12, a non-volatile memory cell (first transistor) 100 and a selective transistor (second transistor) 200 are provided, and thereby a NAND cell unit is formed.

The n-type well 11 is also formed in another region of the substrate 10, and the p-type well 12 is formed in this n-type well 11. A cell transistor (third transistor) 300 and a MOS capacitor 400 having configurations same as that of a selective transistor in the NAND cell unit are provided on this p-type well 12, and thereby a DRAM cell is formed.

Throughout the drawings, a bit line via which data is read and written is denoted by BL, a word line is denoted by WL, and a plate line is denoted by PL. A floating gate is denoted by FG, a control gate is denoted by CG, and a diffusion layer is denoted by AA. A first metal layer is denoted by M1, a source contact is denoted by SLC, and a bit line contact is denoted by BLC. A connection contact between CG and FG is denoted by C-FG-CG, and a connection contact between AA and M1 is denoted by C-AA-M1. As shown in FIG. 1A, a metal layer M0 may be inserted between AA and M1.

The non-volatile memory cell 100 is configured as shown in FIG. 2A. That is, a floating gate (first gate electrode) 14 is formed on the p-type well 12 via a tunnel insulation film (first insulation film) 13. On the floating gate 14, a control gate (second gate electrode) 16 is formed via an inter-electrode insulation film (second insulation film) 15. Source/drain regions 17, 18 are formed interposing a channel below the gate. This memory cell 100 stores data by injecting electrons into (during programming) or releasing electrons from (during erase) from the floating gate 14. Using the phenomenon that a threshold voltage Vt of the memory cell 100 varies during read operation, it is determined whether the data is a "0" or a "1" according to whether a current flows between the source/drain terminals of the memory cell 100.

As shown in FIG. 2B, the selective transistor 200 is formed by providing an opening in the inter-electrode insulation film 15 and embedding a conductive film 19 in the opening, in addition to the configuration of FIG. 2A. That is, the selective transistor 200 is formed by electrically connecting the first gate electrode 14 and the second gate electrode 16.

As shown in FIG. 3, by connecting the plurality of non-volatile memory cells 100 in series in the source/drain direction, a memory string is formed. By connecting the selective transistor 200 at each end of this memory string, a NAND cell unit is formed. The source side of the NAND cell unit is connected to a source line via an SLC, and the drain side is connected to a bit line BL via a BLC.

As shown in FIG. 4A, the cell transistor 300 has a configuration same as that of the selective transistor 200 shown in FIG. 2B. AS shown in FIG. 4B, the MOS capacitor 400 has a configuration same as that of the selective transistor 200 shown in FIG. 2B, except that an implant region (n⁻ region) 20 is formed in a channel region below the gate so as to make the MOS capacitor 400 a depletion type. Thereby, the MOS capacitor 400 is formed as a D-type nMOS capacitor. Further, the area of the gate portion is large so as to secure a large capacitor capacitance.

A gate of the cell transistor 300 is connected to the word line WL, a drain of the cell transistor 300 is connected to a bit line BL, and a source of the cell transistor 300 is connected to a source of the MOS capacitor 400. A gate of the MOS capacitor 400 is connected to the plate line PL, forming a capacitor together with a well. That is, by being connected as shown in FIG. 5A, the cell transistor 300 and the MOS capacitor 400 form a DRAM cell.

This DRAM cell is selected via the word line WL, stores charge between the plate line PL and a cell node of the D-type MOS capacitor, and thereby stores information representing "0" or "1". FIG. 5A is correct as an equivalent circuit, but the actual capacitance is shown in FIG. 5B. That is, the actual capacitance equals to the sum of the capacitance between the FG and the n-region 20 formed directly below it by means of depletion/implantation, the capacitance formed between the n-region 20 and the p-type well 12, the capacitance formed between the cell node of the AA layer and the p-type well, and the capacitance between the cell node and other areas from the FG to the side wall of the CF, and the word line WL to the side wall of the CG.

FIG. 6 shows the case where there is no connection contact between the PL and the FG. In this case, the FG is completely floating. The capacitance between the PL and the channel to which depletion/implantation has been applied becomes a serial capacitance of two capacitors between the PL and the FG and the FG and the channel, which value is lower than the value of the capacitance of FIG. 4B. Since the electric field can be divided in half between the tunnel oxide film between the FG and the channel and the insulation film between the PL and the FG, however, the applied bias between PL and the channel can be approximately doubled, thanks to a low electrical field. Since the potential difference in write potential between "1" data and "0" data of the cell node is doubled, the storage charge will not be greatly deteriorated, even though a little problem occurs as to the withstand pressure of the source (cell node) portion of the cell transistor.

If depletion implantation can be applied similarly to implantation of NAND flash memories so as to achieve cut-off properties of cell transistors, a NAND flash memory and a DRAM cell can be formed on the same chip without using a special process of forming a trench or stacked capacitor. Since the NAND cell unit and the DRAM cell have the same configuration, they can be formed using the same process. That is, the DRAM cell has a configuration different from a usual DRAM configuration having a stacked capacitor or a trench capacitor, and can be formed on the same chip as a NAND flash memory using the same process as the NAND flash memory.

Thus, according to the present embodiment, a DRAM cell is formed using a thick gate oxide film existing in a NAND flash memory and a pn junction, even though a stacked or trench capacitance that embodies a large capacitance with a small area does not exist.

Further, while "0" data represents 0 V, "1" data achieves the necessary charge amount Q expressed by $Q=C \times V$, where C denotes capacitance and V denotes voltage, by writing a high voltage of 3-5 V to a planar capacitor. It is to be noted that the voltage of 3-5 V is higher than the power source Vdd=3.3 V, which is higher than the difference in voltage between the "1" and "0" data of 1.2 V.

FIGS. 7A, 7B are plan views illustrating a layout configuration of the DRAM cell used in the present embodiment, where one memory cell configuration storing 1-bit information is viewed from above.

In FIG. 7A, the word line WL and the plate line PL extend in the lateral direction, and below the CG wiring are formed the MOS capacitor and the diffusion layer AA, which become a cell node, and a cell transistor. Via the cell transistor, the drain side of the cell transistor is connected to the bit line BL of the metal layer via C-AA-M1. Implantation/depletion of the MOS capacitor is arranged so as to surround the overall capacitor.

Compared to the shape of the AA on the capacitor side, the shape of the AA on the cell transistor side is formed in a small size. This is effective in increasing the capacitance of the capacitor, while decreasing the parasitic capacitance of the AA connected to the bit line BL on the drain side of the cell transistor. Further, a layout is configured such that the area of the AA between the MOS capacitor and the cell transistor becomes as large as possible, and the protruding portion from the MOS capacitor becomes large. This is effective in increasing the capacitance between the AA and the p-type well in this portion. This is also effective in increasing the capacitance of between the AA and the CG, FG.

FIG. 7B illustrates a case where the AA width of the MOS capacitor and the channel width of the cell transistor are equal. In this case, the AA does not need to be bent, and the area of the AA between the MOS capacitor and the cell transistor increases. A drawback is that the BL capacitance increases, compared to that of FIG. 7A, but the same advantageous effects as those of FIG. 7A are produced.

After the operation of FIG. 8A that will be described later, driving the PL line involves driving a MOS capacitor having a large capacitance, which slows down the operation of the PL. To address this, a shunt-purpose plate line (not shown), formed of a second metal layer M2 and configured to connect the plate line at a predetermined interval, should be arranged in the vertical direction, both in FIGS. 7A and 7B. Further, with respect to the word line, a shunt-purpose word line (not shown) formed of a * metal layer should be arranged in the vertical direction. Thereby, delay in operation of the PL is suppressed and enhanced speed is achieved.

FIG. 8A is a timing chart illustrating an operation example of the DRAM cell used in the present embodiment. When this operation is applied to the configuration of FIG. 5A of the present embodiment, a high voltage is applied to the inside of the cell, while an application voltage is suppressed on the bit line side.

During standby, a potential of 0 V is stored for "0" data, and a potential of 4 V is stored for "1" data, where the plate line PL=3.4 V. Next, when the word line WL is increased to 3.4 V, charge is read to the bit line BL precharged to 0 V, and 0 V is read for "0" data, and charge Q expressed by $Q=C \times 4$ V (where C denotes cell capacitance) is read for "1" data. For example, when C is 3 fF, 3 fF×4 V=12 fC is read. When the bit line capacitance is 70 fF, the potential will be 170 mV. When the reference BL potential is set to 85 mV, a signal of −85 mV is obtained for "0" data, and a signal of +85 mV is obtained for "1" data.

Thus, even with a small capacitor capacitance compared to the capacitance 20-40 fF of the usual DRAM capacitor, a sufficient cell signal is obtained.

Next, the signal difference is amplified and "0" data is amplified to 0 V, and "1" data is amplified to 2.2 V. After that, the plate line PL is lowered to 0 V, while the word line WL has a high potential of 3.4 V. Since the cell transistor is turned on, 0 V is written back to the cell node for "0" data, and 2.2 V for "1" data. After that, the word line WL is lowered to approximately 2.2 V. In this case, since the source and drain of the cell transistor has 0 V for "0" data, the cell transistor is turned on. In the case of "1" data, on the other hand, since the source and drain of the cell transistor is 2.2 V, the cell transistor is turned off.

Next, the plate line PL, lowered to 0 V, is boosted up to 3.4 V. In this case, the cell node is also boosted up by coupling of the capacitance (mainly the capacitance of the tunnel oxide film portion of the MOS capacitor) between the PL and the cell node. In this configuration, the cell node of "1" data of 2.2 V is boosted up to approximately 4 V, which value differs according to the capacitance rate of the cell node. On the other hand, since "0" data is set to 0 V and the cell transistor is turned on even if the PL is increased to 4 V, the cell node potential remains 0 V, after the BL potential of 0 V is subtracted therefrom.

After that, the word line WL is lowered to 0 V, the bit line BL is precharged to 0 V, and thereby the operation ends. In the end, "0" data becomes 0 V and "1" data becomes a high potential of 4 V, as in the start time, and this high-potential charge is stored in the memory cell.

By applying this PL driving method, it is possible to amplify the cell at 0 V-4 V, storing sufficient charge together with the MOS capacitor of this configuration, while suppressing the amplitude of the bit line to approximately 2.2 V. As a matter of course, a signal can be secured by fixing the PL potential and increasing the amplitude of the cell and the amplitude of the bit line. On the contrary, it is also possible to boost up a higher cell node by amplifying the PL at negative to positive values from −2 V to 3 V. Moreover, the precharge potential of the bit line BL may be set to 0 V, 2.2 V, or an arbitrary potential. Further, the above-described potentials are just an example and a certain degree of modifications may be made without departing from the spirit of the present invention.

FIG. 8B illustrates an example of operation simulation of the DRAM cell used in the present embodiment. The operation of FIG. 8B is the same as that of FIG. 8A, and produces the same effect as that of FIG. 8A. FIG. 8B shows that a stable operation is confirmed in simulation and a cell signal as high as ±100 mV is obtained.

FIG. 9 is a circuit configuration diagram illustrating a sense amplification circuit portion of the DRAM cell used in the present embodiment.

The DRAM cell shown in FIGS. 1A, 1B, and 5A, 5B is approximately the same as the conventional DRAM, but the read signal becomes relatively small with the bit line capacitance equivalent to that of the normal DRAM. FIG. 9 shows a sense amplification circuit capable of decreasing the bit line capacitance and securing a read signal, which configuration is applicable to the operation of the DRAM cell of FIGS. 1A, 1B.

Other circuits necessary for a sense amplifier, including a p-channel flip-flop sense amplifier and an n-channel sense amplifier, are separated in terms of circuit by a Φt signal and its separate transistor. When the cell data is read to the bit line BL, the capacitance of sense amplifiers other than the p-channel sense amplifier is hidden, by setting Φt to a low level. After the potential of the bit line BL is amplified by the p-channel sense amplifier, Φt is set to a high level and other necessary operations are executed. Thereby, the bit line capacitance Cb is decreased, and a sufficient cell signal amount is secured even with a planar capacitor.

Figure 10:
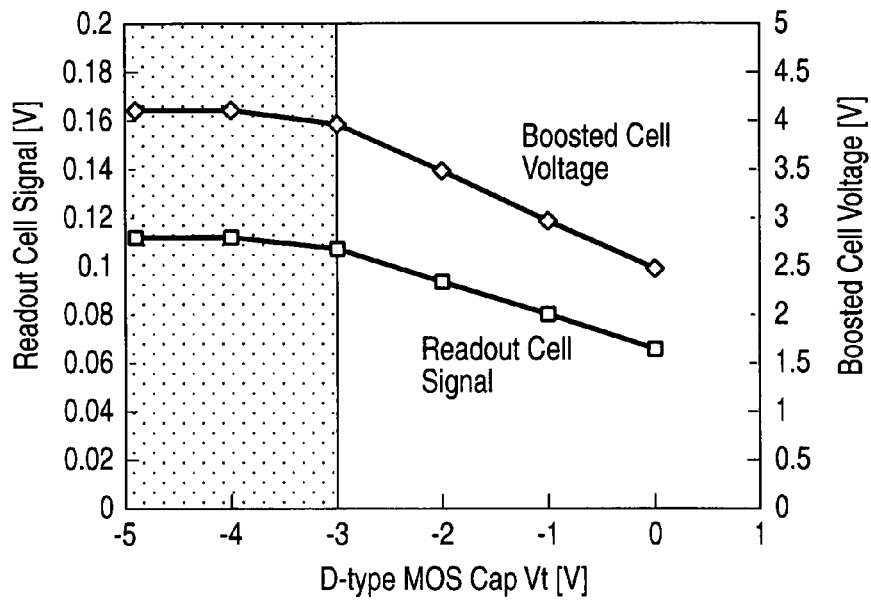
FIG. 10 illustrates a method of setting a threshold voltage of a MOS capacitor portion configured to apply depletion/implantation to the DRAM.
Figures 11A, 11B:
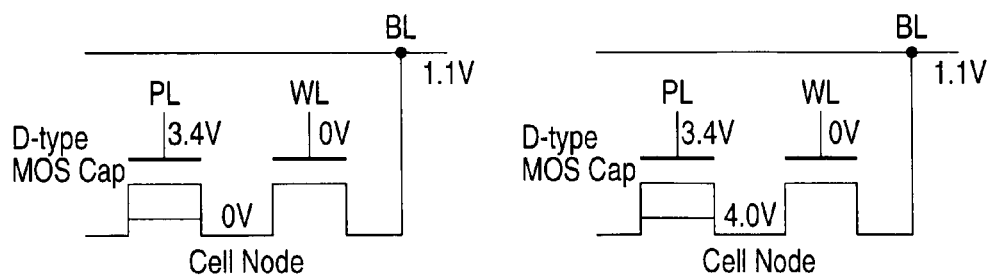
FIGS. 11A and 11B illustrate a potential of each portion when "0" data is held and "1" data is held in the graph of FIG. 10.

FIG. 10 illustrates a method of setting a threshold voltage of the MOS capacitor portion that performs depletion/implantation of the DRAM cell in the present embodiment. Further, FIG. 11A and FIG. 11B shows the potential of each portion when "0" data is held, and when "1" data is held, respectively.

In the graph of FIG. 10, the lateral axis shows the threshold voltage of the MOS capacitor, and the vertical axis shows the relationship between the boost-up voltage of the cell node and the read signal amount. In this case, the amplitude of the bit line BL ranges from 0 V to 2.2 V, the precharge of the bit line BL is 1.1 V, and the boost-up voltage of the PL is 3.4 V. As can be seen from the graph, by setting the threshold voltage of the MOS capacitor to a negative value lower than −3 V, the boost-up voltage of the cell node is saturated at approximately 4 V, and the cell signal of greater than or equal to 100 mV is secured. That is, the threshold voltage of the MOS transistor should desirably be set to be less than or equal to −3 V. This is because the concentration of electrons of the reverse channel increases by doping As or P ions, which causes decrease in thickness of the depletion layer formed between the channel and the PL and increase in capacitance.

Thus, according to the present embodiment, it is possible to improve the system properties by combining a DRAM cell with a NAND flash memory. Further, the DRAM cell can be configured using a cell transistor and a MOS capacitor having substantially the same configuration as that of a non-volatile memory cell or a selective transistor forming the NAND flash memory. Accordingly, the DRAM cell can be manufactured in the same process as the NAND flash memory, and thereby increase in manufacturing cost or chip area is suppressed.

That is, it is possible to combine a DRAM cell that has a less cell area than that of the SRAM, with a NAND flash memory chip, without requiring a large processing cost, and thereby the system properties such as data retention and signal margin of the NAND is improved while suppressing the chip cost.

Second Embodiment

Figure 12:
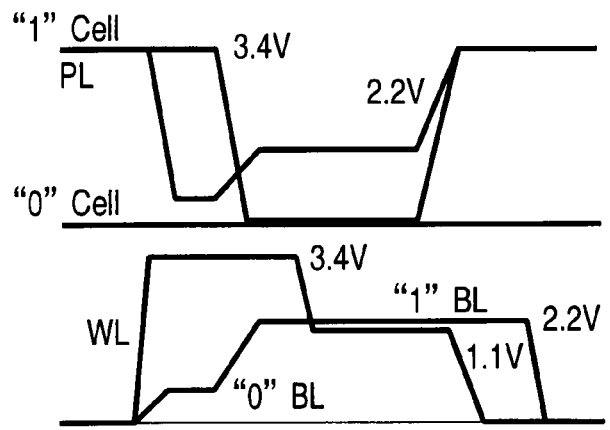
FIG. 12 is a timing chart illustrating another operation example of the DRAM cell combined with a NAND flash memory, according to the second embodiment.

FIG. 12 is a timing chart illustrating another operation example of a DRAM cell combined with a NAND flash memory, according to the second embodiment. The basic operation and advantageous effects obtained therefrom are the same as those of FIGS. 8A and 8B. Further, the configurations of the NAND flash memory and the DRAM cell are the same as those of the first embodiment.

The second embodiment is different from the example of FIG. 8A in that the potential of the cell node becomes approximately the same as the plate potential when "1" data is boosted up. This means that a high voltage is prevented from being applied to the inside of the cell, which is efficient in improving the reliability.

Assume that a high-level potential of the bit line is denoted by VBL, a high-level potential of the plate is denoted by VPL, the capacitance between the PL and the channel is denoted by $C1$, and the capacitance between the cell node and Vss, such as a p-type well is denoted by $C2$. In this case, the high-level voltage of the cell node is expressed as follows: $\{C1 \times VPL + (C1+C2)VBL\}/(C1+C2)$. Assuming that the resultant value of this formula is equal to VPL, the following relationship is satisfied: VPL=high-level in cell node. As a result thereof, the equation below is satisfied: $C2 \times VPL = (C1+C2) VBL$.

When this equation is satisfied, (PL of "0" data)−(voltage between cell nodes) yields −VPL, and (PL during "1" data)−(voltage between cell nodes) yields 0 V. Further, when "1" data is held, the difference in potential between the source side (between the cell and nodes) and the word line WL becomes −VPL. This reflects better terms where the voltage of greater than or equal to VPL is not applied to the inside of the cell.

That is, when VPL=3.7 V and VBL=2.2 V, for example, since 1.68 $C2=C1+C2$, the following equation is satisfied: 0.68 $C2=C1$. Further, by increasing the dose amount of depletion/implantation and increasing the capacitance between the channel and the p-type well and the area of the AA between the MOS capacitor and the cell transistor, the following relationship is achieved: 0.68 $C2=C1$.

Further, even when the potential of the cell node becomes higher than the plate voltage when 0.68 $C2>C1$, there is also an approach of securing reliability by lowering the n-type impurity concentration on the cell node side of one of the cell transistors. When a high voltage is applied to the cell node when WL=0 V, the CG on the source (cell node) side is connected to an n-type source via an oxide film, and the n-type source becomes depleted because of the low impurity concentration and high source potential. By dividing this high pressure between the depletion layer and the gate insulation film, high reliability is secured.

Third Embodiment

Figure 13A:
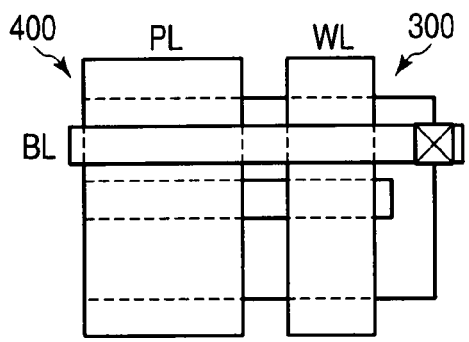
FIGS. 13A and 13B are a plan view and a cross-sectional view, respectively, illustrating a configuration of a DRAM cell used in the third embodiment.
Figure 13B:
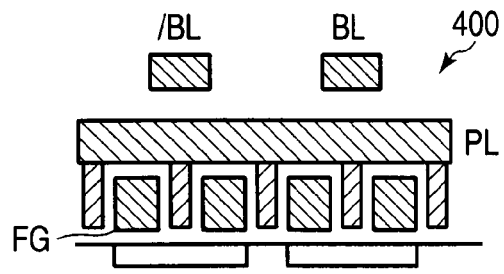

FIG. 13A is a plan view of a layout configuration and FIG. 13B is a cross-sectional view, illustrating a DRAM cell used in the third embodiment. The basic configuration of the NAND flash memory and the DRAM cell is the same as that of the first embodiment.

As shown in FIG. 13A, the MOS capacitor 400 and the cell transistor 300 are divided into a plurality of portions, and an AA is connected in parallel thereto in the vicinity of a contact portion of the bit line BL. Thereby, as shown in FIG. 13B, a large coupling capacitance is secured between the FG and the CG (PL), using the side wall portions of the FG as well, as in the general FG-type NAND flash memory. That is, by dividing the FG into a plurality of portions, the capacitance between the PL and the cell node is increased. Other advantageous effects obtained therefrom are the same as those described in the first embodiment.

Fourth Embodiment

Figure 14A:
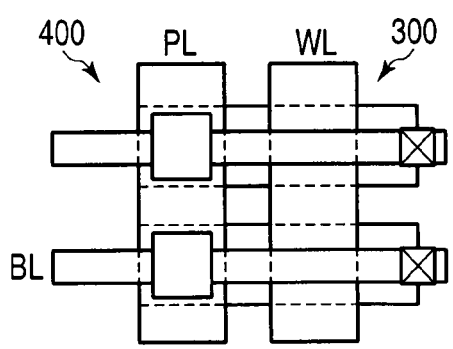
FIGS. 14A and 14B are a plan view and a cross-sectional view, respectively, illustrating a configuration of a DRAM cell used in a fourth embodiment.
Figure 14B:
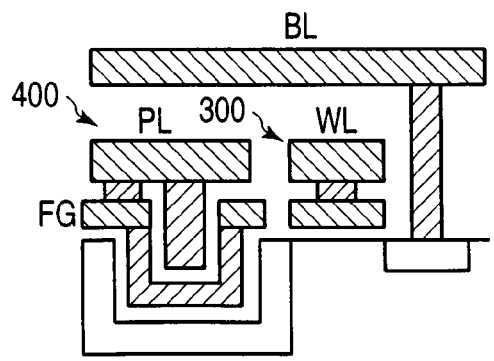

FIG. 14A is a plan view of a layout configuration and FIG. 14B is a cross-sectional view, illustrating a DRAM cell according to the fourth embodiment. The basic configuration of the NAND flash memory and the DRAM cell is the same as that of the first embodiment.

In the present embodiment, a shallow trench is formed in a MOS capacitor portion, and thereby a capacitance between a channel portion and a FG portion is sterically increased. This trench is different from the conventional trench in that it can be sufficiently achieved even if the ratio of the diameter of the hole to the depth thereof is as small as (depth/diameter)≤2. Accordingly, a DRAM cell can be combined with a NAND flash memory without making a significant change to the manufacturing process.

Fifth Embodiment

FIGS. 15A-15C illustrate a DRAM cell used in the fifth embodiment. FIG. 15A is a plan view of a layout configuration, FIG. 15B is a cross-sectional view cut along the central portion of a BL wiring, and FIG. 15C is a cross-sectional view cut along the central portion of the /BL wiring. The basic configuration of the NAND flash memory and the DRAM cell is the same as that of the first embodiment.

In the present embodiment, as shown in FIG. 15A, a cell transistor 300 is connected to both ends of a MOS capacitor 400, and the other end of the cell transistor is connected to a BL and a /BL. Since a voltage can therefore be applied from both ends of the MOS capacitor 400 and a signal can be read from both ends, a signal 4 times as great as a signal of a normal 1T/1C DRAM cell is obtained.

FIG. 16A is an operation example and FIG. 16B is an equivalent circuit of the DRAM cell of the present embodiment. Even with a MOS capacitor formed in a NAND process of approximately 3 fF, a sufficient signal as expressed by ±2.2 V×3 fF/70 fF=±180 mV is obtained with a voltage of approximately 2.2 V. In this case, too, the FG and the CG forming the MOS capacitor are connected such that the capacitance of the MOS capacitor increases.

Sixth Embodiment

Figure 17A:
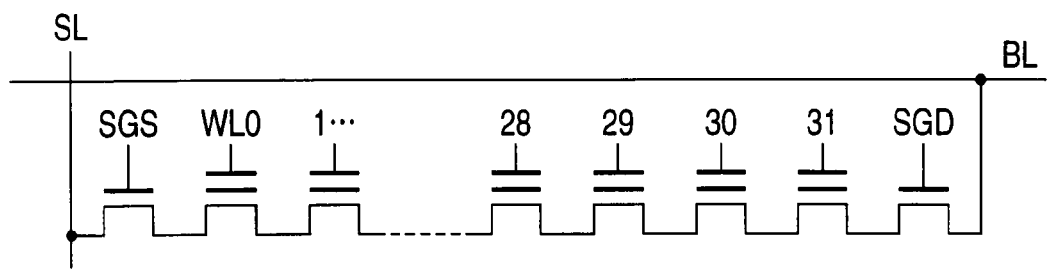
FIGS. 17A and 17B illustrate a configuration and an operation of a DRAM cell used in the sixth embodiment.
Figure 17B:
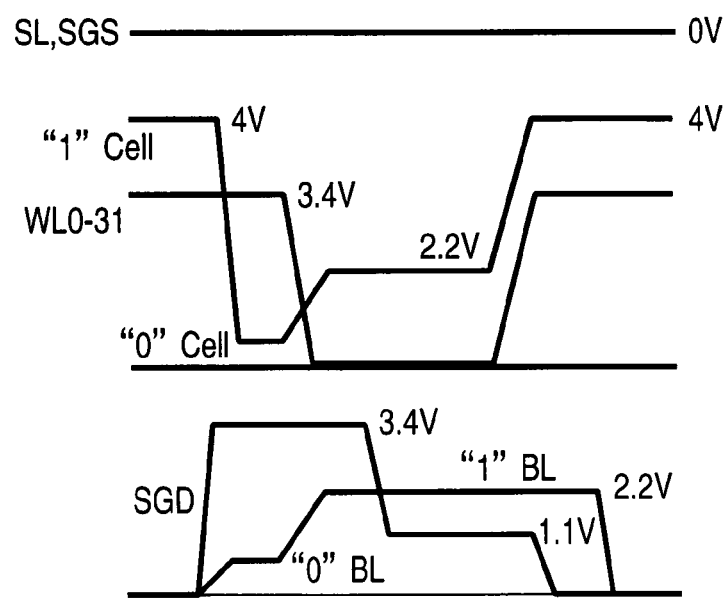

FIGS. 17A and 17B are a equivalent circuit diagram and a timing chart, respectively, illustrating a configuration and an operation of the DRAM cell used in the sixth embodiment.

The DRAM cell of the present embodiment has a configuration same as that of the NAND flash memory shown in FIGS. 1A and 1B and FIG. 3. That is, while the DRAM cell of the present embodiment has a configuration same as that of the NAND flash memory, it can also be used as a DRAM depending on how a voltage is applied.

When the cell string portion and the DRAM cell portion of the NAND flash memory are formed on the same chip, if the conditions are set such that the cell size of the NAND is reduced to the minimum possible lithography resolution and the minimum possible precision of the processing device, the resolution and the processing precision of portions other than cells having a random shape or wiring, or a different line and space (L/S) will deteriorate. Thereby, the design rule of the NAND flash memory will be very lax in portions other than cells. This results in decrease in precision of processing the DRAM cell, compared to the NAND flash memory.

In the present embodiment, as shown in FIG. 17A, the DRAM cell is configured using the same configuration as that of the cell string of the NAND flash memory, in order to solve the above-described problem, as shown in FIG. 17A. Further, as shown in the operation diagram of FIG. 17B, the same configuration as that of the cell string of the NAND flash memory can be used as a DRAM designed to store charge merely by varying the operation.

As shown in FIG. 17B, by setting the SGS constantly to a low level and separating the cell string from the SL, causing the WL0-WL31 to perform the same operation as that of the PL in FIGS. 8A and 12, and causing the SGD to perform the same operation as that of WL in FIGS. 8A and 12, the NAND flash memory can be used as a DRAM. This is because the total capacitance of the cell node inside the cell string becomes approximately 1 fF. That is, during standby, 0 V is stored as "0" data, and 4V is stored as "1" data, where the plate lines WL0-WL31=3.4 V.

Next, when the SGD is increased to 3.4 V, charge is read to the bit line BL precharged to 0 V, and charge of 0 V is read as "0" data, and charge of Q=cell capacitance C×4 V is read as "1" data. After that, this signal difference is amplified to 0 V as "0" data and to 2.2 V as "1" data. After that, WL0-WL31 are lowered to 0 V while the SGD is as high as 3.4 V. Since the SGD is turned ON, 0 V is written back to the cell node as "0" data, and 2.2 V as "1" data.

Next, the SGD is lowered to approximately 1.1 V, at which the transistor is slightly turned on. In this state, since the source/drain of the SGD has 0 V as "0" data, the SGD is turned on. As for "1" data, on the other hand, since the source/drain of the SGD has 2.2 VG and the gate potential is lower than the source/drain, the SGD is set to an off state.

After that, the WL0-WL31 that have been lowered to 0 V are boosted up to 3.4 V. In this state, the cell node is also boosted up to approximately 4 V, through coupling of the capacitance between the WL0-WL31 and the cell node. On the other hand, since "0" data is set to 0 V and the SGD is turned on even if the WL0-WL31 are increased to 4 V, the cell node potential is drained by the BL potential of 0 V and remains 0 V.

After that, the SGD is lowered to 0 V, the bit line BL is precharged to 0 V, and thereby the operation ends. In the end, the cell node has a potential of 0 V as "0" data, and a high potential of 4 V as "1" data, as in the start time. This charge is stored in the memory cell.

As described above, since the DRAM cell is formed with the same configuration as that of the NAND cell string, the size of the DRAM cell can be decreased.

FIGS. 18A-18C illustrate an element configuration of the DRAM cell of FIG. 17A. FIG. 18A is a cross-sectional view cut along the BL direction, FIG. 18B is a plan view, and FIG. 18C is a cross-sectional view cut along the WL direction.

As clear from the comparison with FIGS. 1A and 1B, the DRAM cell is configured using the NAND cell string configuration as it is. As a matter of course, the channel length L of the SGD may be provided longer than that of the NAND cell, or the threshold voltage of the SGD may be increased, as long as the shape is not greatly varied. The impurity concentration of the cell node may also be varied, such that the boost-up voltage is varied. Further, a DRAM may be formed using two NAND cell strings so as to store one-bit information. Moreover, the above-described configuration may also be configured such that it can be used both as a normal NAND cell and as a DRAM.

Further, by writing non-volatile data to cells of the WL0-WL31, and then writing charge of a DRAM operation to the cell node, both the non-volatile data of the WL0-WL31 and the volatile 1-bit data can be simultaneously stored.

FIGS. 19A-19D illustrate an operation diagram when the DRAM cell configuration shown in FIGS. 17A and 18A-18C is used as a NAND flash memory, maintaining its DRAM cell configuration. FIG. 19A shows an erase operation, FIG. 19B shows a program operation, FIG. 19C shows a program-inhibit operation, and FIG. 19D shows a read operation. The left drawings show potentials applied to each cell, and the right drawings show variation in threshold of the memory cell.

As described above, the above-described configuration functions as a DRAM when the operation of FIG. 17B is performed, and as a non-volatile memory when the operation of FIGS. 19A-19D is performed.

Seventh Embodiment

FIG. 20A shows a program sequence and FIG. 20B shows variation in threshold voltage distribution in a memory cell, designed to illustrate a problem of the conventional NAND flash memory.

In the NAND flash memory, the gate voltage is set to approximately 17 V, the channel potential is set to 0 V, and "0" data is programmed. However, as shown in FIGS. 20A and 20B, when an electron is ejected to the FG of the cell (during program operation) in order to increase the threshold voltage of the cell, the potential of the adjacent FG fluctuates, due to the effect of coupling of the charge. This causes the threshold voltage of the adjacent cell to fluctuate. This becomes more significant as miniaturization is enhanced. Further, this becomes particularly serious in a multi-value multi-level cell (MLC) NAND flash memory that stores data of a number of bits by setting a number of threshold voltages., as shown in FIG. 20B. Under the circumstances, a promising approach is to write a voltage roughly to the overall adjacent cell, bring the threshold voltage of the adjacent cell to a close value, and then perform a program operation to set the threshold value to a detailed value.

In this case, it is also necessary to consider the effect of cells apart from each other by 2 or more, as shown in FIG. 20A. As a result, data (4 pages=32 KB) of a plurality of adjacent cells becomes the unit of writing, as well as data (1 page=8 KB) of one word line WL, in the case of FIG. 20A. Further, a plurality of items of data (3 pages=24 KB where 8 values: 3 bits) are required in one multi-value word line WL. In the conventional NAND flash memory configuration, however, only a page buffer of 1-2 pages can be provided on cell array ends. This is because the page buffer is formed of an SRAM and the cell size is significantly big.

FIG. 21 illustrates a configuration of a fusion memory according to the seventh embodiment. An SRAM as a page buffer 32 is provided adjacent to an array of a NAND flash memory 31. A DRAM buffer 33 is connected to the SRAM buffer 32. Since the DRAM buffer 33 does not require a trench or stacked configuration, as described above in the first to sixth embodiments, the DRAM buffer 33 has a capacitance several times as large as that of the SRAM buffer 32, even though the area is small.

In the example of the present embodiment, a case has been described where the page size is 4 KB. Conventionally, only a 4 KB sense/latch buffer and a 4 KB data latch buffer have been mounted on the array end of the NAND flash memory 31. This is because the chip size increases when the capacitance of the SRAM is increased. In the present embodiment, on the other hand, by mounting a buffer using a DRAM cell having a small cell size inside the chip, it is possible to store data on a plurality of pages of the adjacent cell, as described with reference to FIGS. 20A and 20B. Thereby, a high-speed NAND flash write operation can be achieved. Further, the above-described configuration can also be used as a read cache during read operation, and thereby the speed can be further enhanced.

It is to be noted that the necessary DRAM amount of buffer is expressed by (page size)×(number of pages (PG))×(number of arrays (P))×(number of arrangements in parallel). Since data is fetched from outside the chip and the fetched data needs to be transferred to a page buffer of a NAND memory cell array, the parallel number usually needs to be doubled.

Eighth Embodiment

FIG. 22A is a block diagram illustrating the overall configuration of a fusion memory and FIG. 22B is a timing chart illustrating a data writing method thereof, according to the eighth embodiment.

In the present embodiment, a method of writing a high-speed bandwidth to a NAND flash memory, utilizing a DRAM cell combined with an array of a NAND flash memory 41 and used as a plurality of page buffers is shown.

As a circuit configuration, as shown in FIG. 22A, in addition to the array of the NAND flash memory 41 and the usual page buffer 42, a DRAM buffer 43 is provided, such that high-speed data transfer can be performed between the page buffer 42 and the DRAM buffer 43. As described in the first to sixth embodiments, the DRAM buffer 43 does not require a trench or stacked configuration, and has a capacitance several times as large as that of the SRAM buffer 42, in spite of the small area.

In operation, as shown in FIG. 22B, data is written to a cell string of block A via a bit line BL. In this case, during program operation, a selective word line is set to Vpgm and the cell node is set to 0 V, as shown in FIG. 19.

During program-inhibit operation, the selective word line is set to Vpgm, the cell node is self-boosted to approximately 7 V, and program-inhibit operation is performed. During program operation or program-inhibit operation, since the SGD is turned off and a tunneling current is caused to flow slowly, the bit line BL can be released in the meantime. Using this period of time, information stored in the DRAM buffer 43 is transferred to the page buffer 42, and is further transferred to the bit line BL, and the data is written to another block B. This operation is the same as that of block A. In a verify operation of verifying whether data has been programmed, however, the bit line BL is used so as to read the written data to the bit line BL.

In this way, by providing a volatile RAM inside, such as the DRAM buffer 43, it is possible to program a plurality of blocks in parallel, as shown in FIG. 22B. Further, it is also possible to verify and program different blocks in parallel. Although such an operation can be performed in a large buffer of a usual SRAM, as well as a DRAM, a memory using the above-described DRAM cell is preferable considering the cost involved. Further, the memory used in the buffer may also be a non-volatile RAM, such as a FeRAM.

Thus, according to the present embodiment, it is possible to write data to a plurality of blocks in parallel, using a plurality of DRAM page buffers provided in a NAND flash memory. It is therefore possible to enhance the writing speed of the NAND flash memory.

Ninth Embodiment

Figure 23:
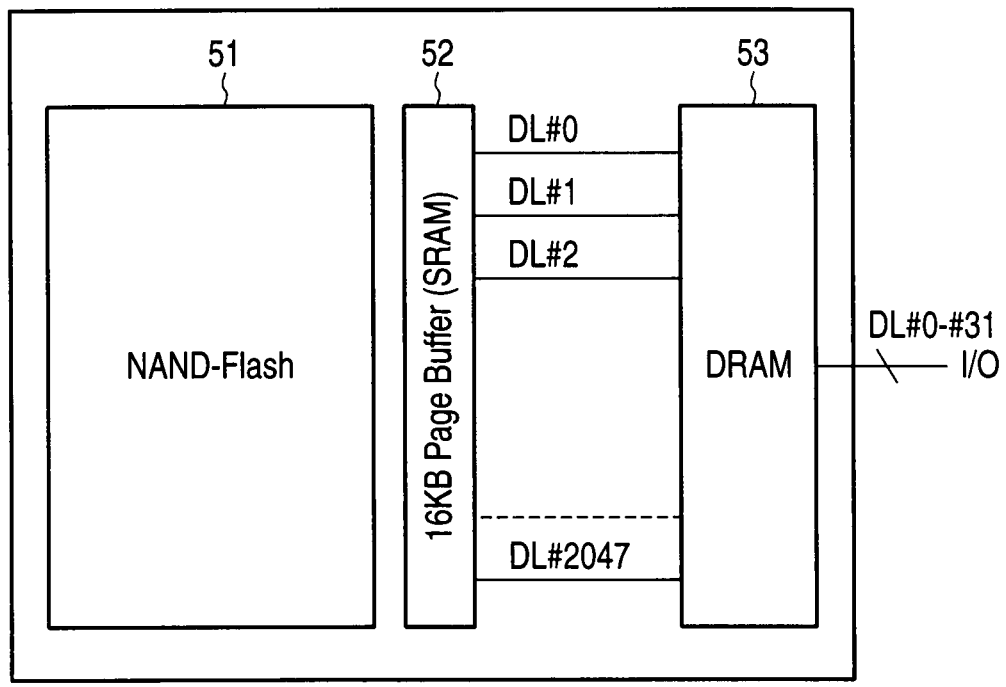
FIG. 23 is a block diagram illustrating a configuration of a fusion memory according to the ninth embodiment.

FIG. 23 is a block diagram illustrating a schematic configuration of a fusion memory according to the ninth embodiment.

An array of a NAND flash memory 51, an SRAM page buffer 52, and a DRAM buffer 53 are mounted on the same chip. As described in the first to sixth embodiments, the DRAM buffer 53 does not require a trench of stacked configuration, and has a capacitance several times as large as that of the page buffer 52, in spite of the small area.

Transfer is performed in parallel between the page buffer 52 and the DRAM buffer 53, and in serial between the DRAM buffer 53 and the IO. When the DRAM buffer 53 and the page buffer 52 are physically approximated, there will be no problem, since there are more than several hundred data transfer wirings. For example, when there are 2048 data lines with respect to the page buffer size of 16 KB, data is transferred to the page buffer at 16 KB/2K=only 64 cycles.

Thus, according to the present embodiment, it is possible to provide high-speed data transfer by utilizing the DRAM cell combined with the array of the NAND flash memory 51 and used as the page buffers 53 and transferring data between the SRAM page buffer 52 and the DRAM buffer 53 in parallel.

Tenth Embodiment

Figure 24:
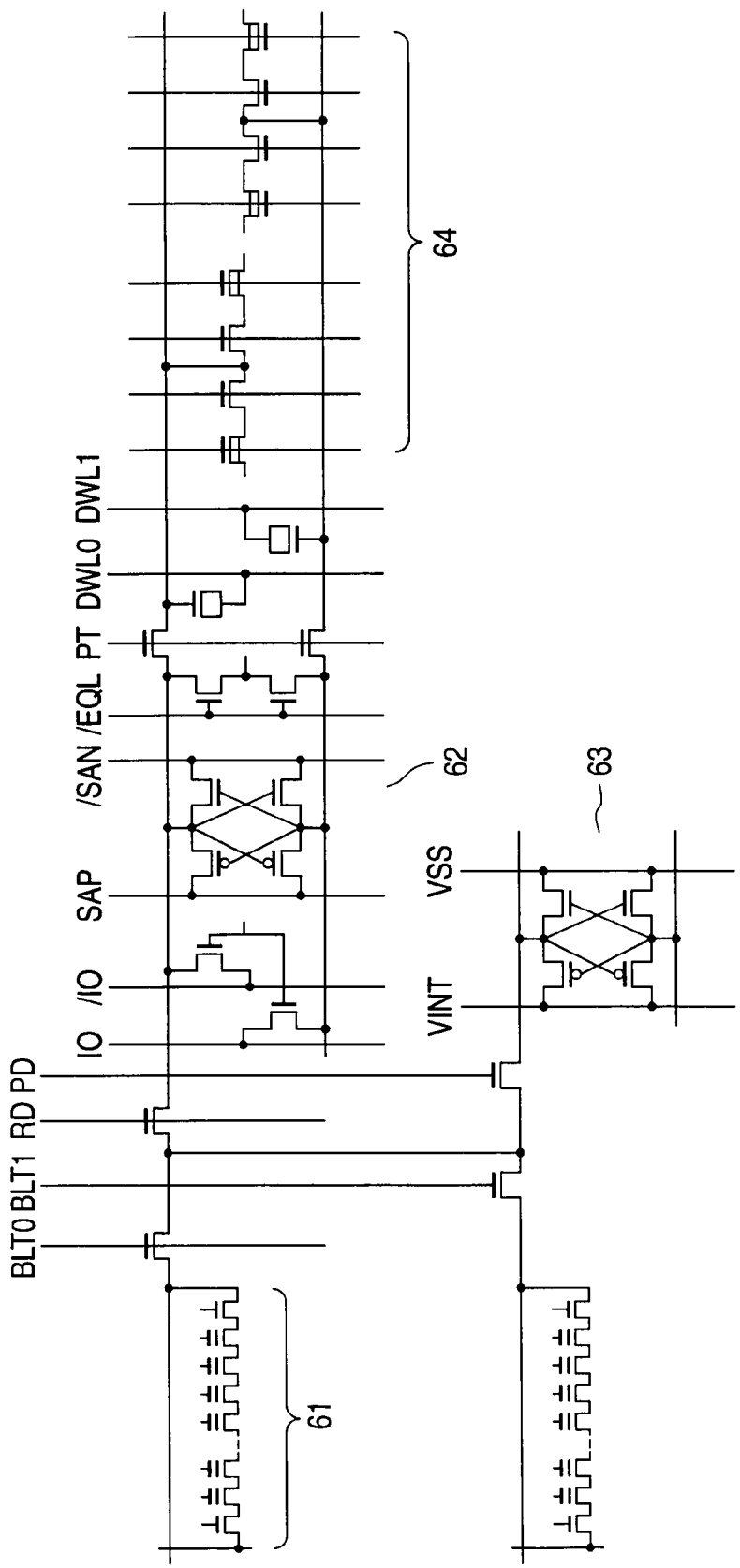
FIG. 24 is a circuit configuration diagram illustrating a configuration of main elements of a fusion memory according to the tenth embodiment.

FIG. 24 is a circuit configuration diagram illustrating a configuration of main structural elements of a fusion memory according to the tenth embodiment.

As in the previous embodiment, a cell array of a NAND flash memory 61 and a DRAM cell 64 used as a plurality of page buffers are provided on the same substrate. Further, a sense amplifier portion (a data cache circuit 62 and a sense latch circuit 63) are shared between the cell array of the NAND flash memory 61 and the DRAM cell 64.

In FIG. 24, BLTi denotes a separate signal separating the NAND cell array and the page buffer, IO denotes an IO line connecting the exterior and the page buffer, SAP, /SAN denotes a sense amplification activation signal, PT denotes a separate signal separating a sense amplifier of the page buffer and the DRAM array, DWLi denotes a dummy word line, and EQL denotes an equalized signal. As previously described in the first to sixth embodiments, the DRAM cell 74 does not require a trench or stacked configuration. Further, the sense latch circuit 63 may be omitted.

According to this configuration, the chip area can be reduced. Data read from the DRAM cell 64 is amplified by a pMOS/nMOS flip-flop of the sense amplifier portions 62, 63 and latched. That is, this latch portion is also used as a flip-flop of the data latch of the NAND flash memory 61. Accordingly, the flip-flop data is directly transferred to the bit line BL of the NAND flash memory 61 from the data latch portion. That is, it is possible to provide high-speed data transfer, as in the ninth embodiment.

Eleventh Embodiment

Figure 25:
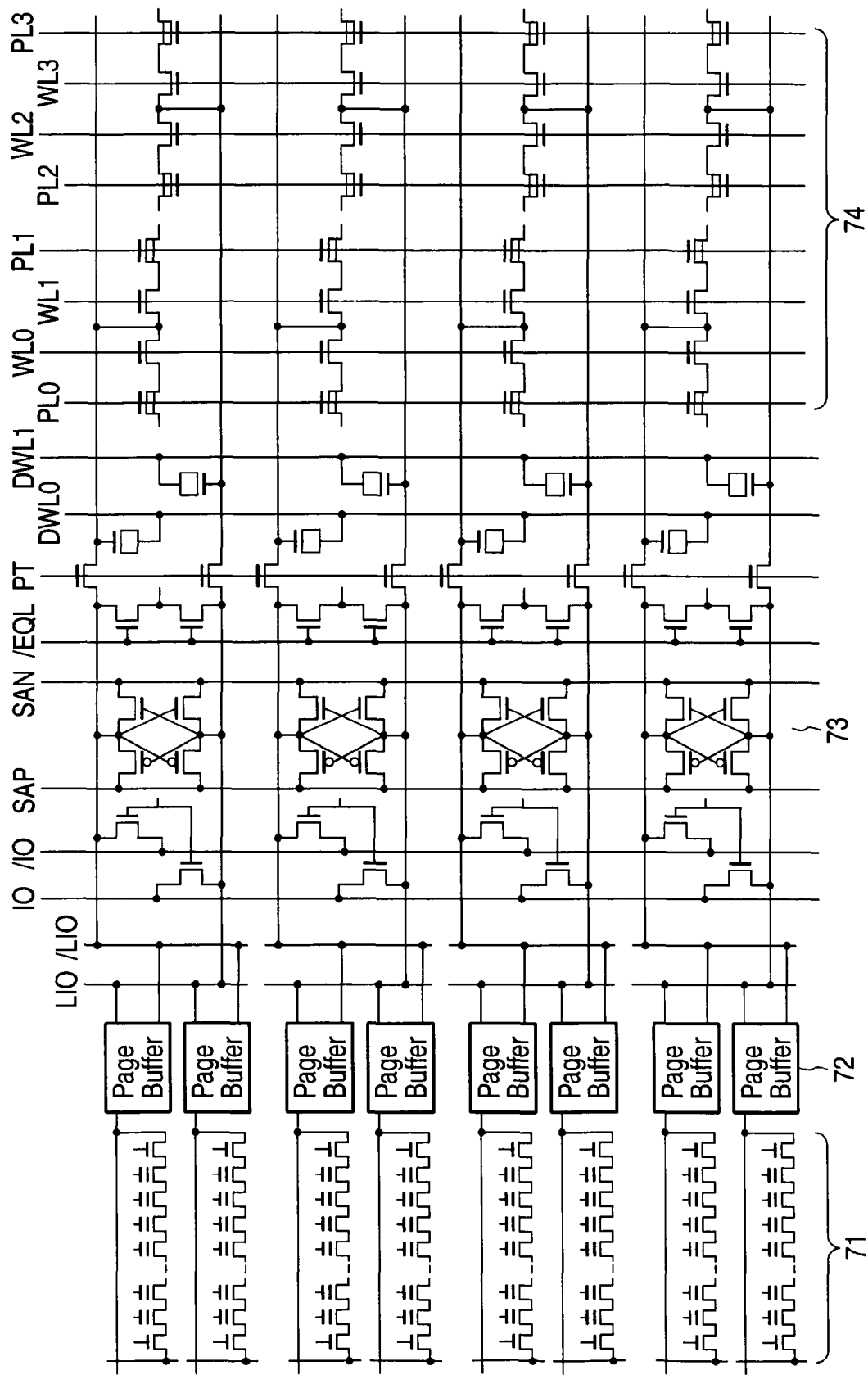
FIG. 25 is a circuit configuration diagram illustrating a configuration of main elements of a fusion memory according to the eleventh embodiment.

FIG. 25 is a circuit configuration diagram illustrating a configuration of main structural elements of a fusion memory according to an eleventh embodiment. In this drawing, the reference numeral 71 denotes a NAND flash memory, the reference numeral 72 denotes a page buffer, the reference numeral 73 denotes a sense amplifier, and the reference numeral 74 denotes a DRAM cell.

In the present embodiment, as in the above-described tenth embodiment, a cell array of a NAND flash memory 71 and a DRAM cell 74 used as a plurality of page buffers are provided on the same substrate. Further, the sense amplifier 73 is shared between the cell array of the NAND flash memory 71 and the DRAM cell 74. As previously described in the first to sixth embodiments, the DRAM cell 74 does not require a trench of stacked configuration.

Data is transferred to a latch connected to a SAP and a SAN via IO, /IO from outside the chip, and the transferred data is written to the DRAM cell 74 via a selected word line of the DRAM cell. When the written data is written to the NAND flash memory 71, the data is amplified via a selected word line WL and read to a latch circuit connected to the SAP, SAN. The DRAM cell 74 is omitted at the ratio of 1 to a certain number of BLs of the NAND flash memory 71. The read data is transferred to one of a plurality of page buffers 72, via LIO, /LIO divided at the ratio of one latch circuit of the DRAM cell 74. When data is repeatedly read by selecting other word lines WL, the DRAM data of all the pages will be transferred to the buffer 72.

Thus, by causing one DRAM sense amplification circuit 73 and each of the word lines of a plurality of (N number of) DRAM cells 74 connected thereto to be transferred to a plurality of page buffers by a plurality (N) of page buffers 72, the DRAM cell 74 having the same capacitance as that of the page buffer 72 is provided. Moreover, by providing M number of cells connected to the sense amplifier 73, a capacitance M/N times as large as that of the page buffer 72 is secured. This data having the capacitance several times as large as that of the page buffer 72 is applicable to various applications described above, and enhances the speed of the NAND flash memory, while suppressing the size of the chip.

Twelfth Embodiment

Figure 26A:
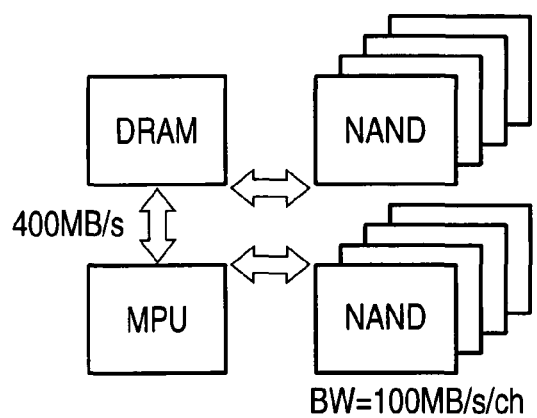
FIGS. 26A, 26B and 26C are block diagrams illustrating a configuration of a fusion memory according to the twelfth embodiment.
Figure 26B:
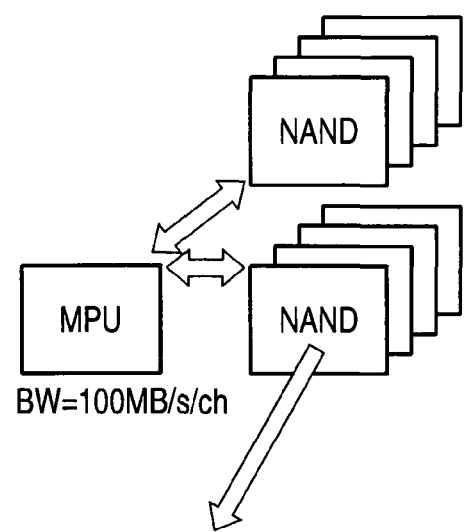
Figure 26C:
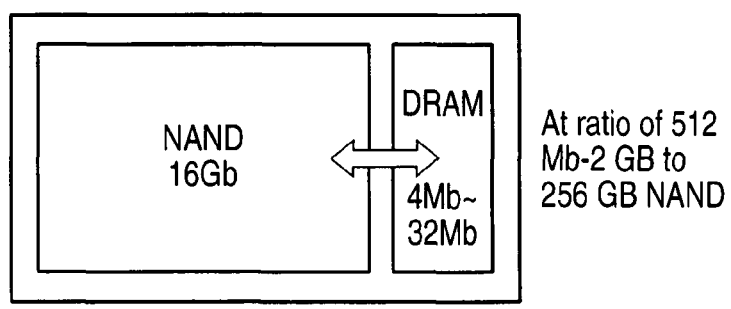

FIGS. 26A-26C are block diagrams illustrating a configuration of a fusion memory according to the twelfth embodiment.

FIG. 26A is a configuration of a general SSD, in which a DRAM as a cache or a buffer is provided together with a NAND flash memory.

FIG. 26B shows an SSD (Sold-State Disk) of the present embodiment, including a DRAM cell in the NAND flash memory. This configuration is possible because a DRAM cell with the same configuration as that of a NAND cell unit can be provided on the same substrate, as in the above-described sixth embodiment.

FIG. 26C shows a configuration in which a plurality of chips each including a NAND flash memory and a DRAM cell are provided as shown in FIG. 26B.

Thus, according to the present embodiment, a single DRAM, such as MPU-1st-3rdSRAM-signal cache-DRAM cache-NAND flash memory or a DRAM module will not be required, unlike the conventional SSD-based personal computer. Accordingly, a computer can be configured only by an MPU (including an SRAM cache) and the NAND flash memory combined with the DRAM of the present embodiment. In this case, since the NAND flash memory and the DRAM can be mounted on the same chip, the inner bus width can be increased to as great as 128-2048, for example.

Accordingly, the bandwidth of this portion will be greatly improved, and thereby computer properties are improved.

Assuming that the properties of 1 chip are shown as follows:
DRAM Random Cycle=100 ns;
DRAM to NAND BW=20 MB/s; and
NAND to DRAM BW=320 MB/s,
the properties of a 8-NAND stack configuration including 8 chips stacked thereon are shown as follows:
DRAM to NAND BW=160 MB/s; and
NAND to DRAM BW=2.5 GB/s.

Thirteenth Embodiment

Figure 27A:
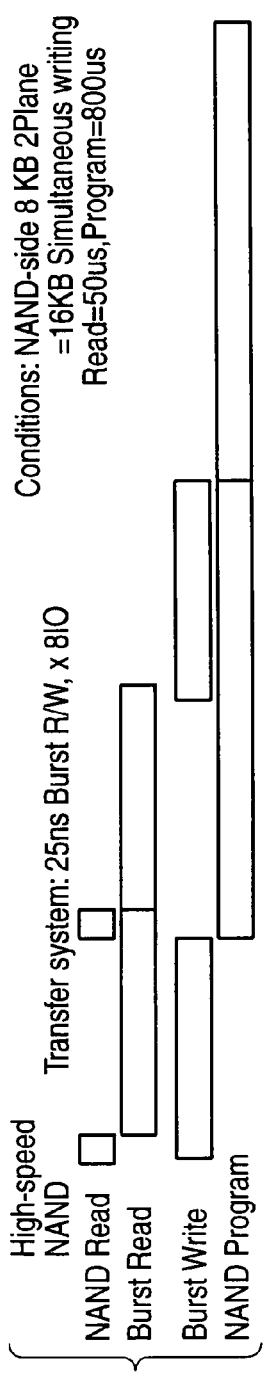
FIGS. 27A, 27B and 27C illustrate a method of transferring data in a fusion memory according to the thirteenth embodiment.
Figure 27B:
Figure 27C:
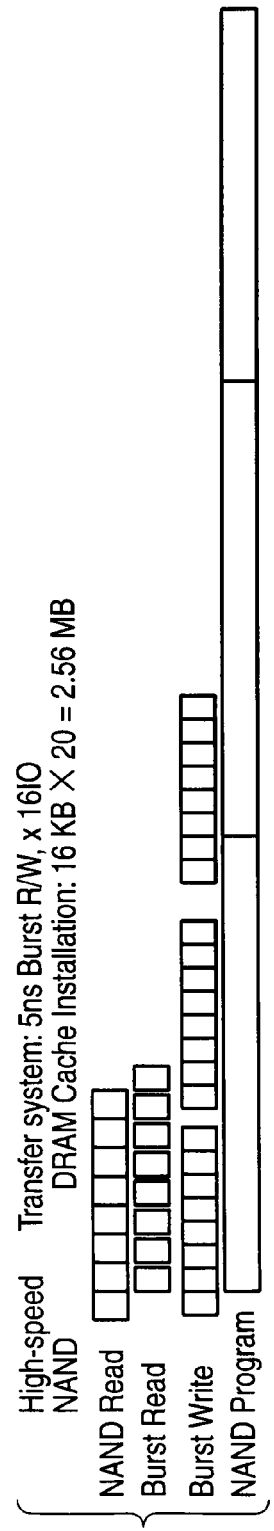

FIGS. 27A-27C illustrate a method of transferring data according to the thirteenth embodiment. FIG. 27A shows an example of a low-speed NAND, FIG. 27B shows an example of a high-speed NAND, and FIG. 27C shows an example of an ultra-high-speed NAND.

In the present embodiment, a method of transferring data to a chip in which a DRAM cell used as a plurality of page buffers is combined with a NAND flash memory and a method of programming the data will be described.

In the conventional low-rate NAND operation as shown in FIG. 27A, during read operation, data has been read from the NAND flash memory, and was transferred in serial. During write operation, data has been transferred in serial and written to the page buffer, and then programmed into a NAND flash memory. When the data rate of serial transfer is as low as this, there is no significant overhead time.

When the transfer rate in burst reading and burst writing becomes as high as that of the high-rate NAND shown in FIG. 27B, for example, there will not be much problem in reading, but the writing speed will be controlled by the programming time to the NAND after transfer. It is thereby impossible to provide sufficient a high-speed operation. In this example, an example of a double page buffer is shown, where data of another page is fetched while one page is programmed, but the operation becomes reliably slow.

FIG. 27C shows an ultra-high-speed NAND operation of the present embodiment. In this example, a case is described where a DRAM cell having a capacitance 20 times as large as that of a page buffer is mounted inside the chip. In this case, the time during which a program is written will be subjected to the same restrictions, but since the data has already been transferred to a DRAM cell, it looks as if the writing operation has been ended when viewed from outside the NAND chip. Furthermore, the RAM data from which the data has been transferred can be deleted.

Usually, a significant number of pages of data are not transferred endlessly, and if data is transferred to the NAND side once, the data can be written at a vacant period of time. Thus, the actual write bandwidth will be greatly improved.

The capacitance of the DRAM cell should preferably be as large as possible, and a DRAM capacitance capable of keeping transferring data for at least one program time will be very efficient. This can be achieved as an SRAM cell, too, but when achieved as a DRAM cell, as previously described in the first to sixth embodiments, it is possible to achieve both high-speed operation and low cost.

Fourteenth Embodiment

Figure 28A:
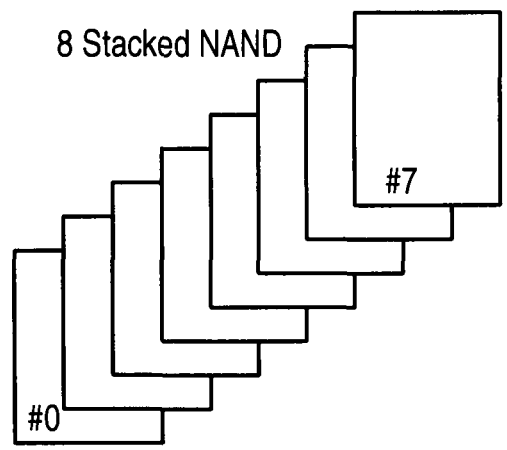
FIGS. 28A and 28B illustrate a method of transferring data in a fusion memory according to the fourteenth embodiment.
Figure 28B:
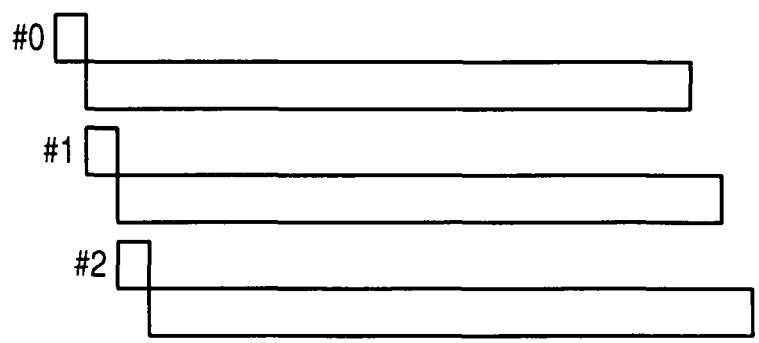

FIGS. 28A, 28B illustrate a method of transferring data according to the fourteenth embodiment. FIG. 28A shows a configuration in which a plurality of chips each combining a DRAM cell with a NAND flash memory are stacked, and FIG. 28B shows data transfer and program state of each chip.

In the present embodiment, an application example will be described in which a DRAM cell used as a plurality of page buffers is combined with a NAND flash memory.

When a plurality of NAND chips are mounted on one bus, inefficient configuration as shown in FIG. 27B is reduced to some degree. This is because data can be transferred to #1 while data is transferred to #0 and programmed, as shown in FIG. 28B. When all the chips are in a program state, however, data cannot be transferred in the conventional technique.

In the present embodiment, on the other hand, since a DRAM cell is included in each of the NAND chips, additional data of an amount corresponding to (number of pages/each chip)×(number of chips) can be efficiently transferred. Further, during read/program operation of another block or another page of the same chip, the approach of FIG. 28B cannot be adopted in the conventional technique. In the present embodiment, on the other hand, data can be transferred by utilizing the DRAM cell even in such a case.

Fifteenth Embodiment

FIGS. 29A-29C are timing charts showing the operation example of a DRAM cell provided on a NAND flash memory, according to the fifteenth embodiment.

The waveforms in FIGS. 29A-29C represent a word line WL, a plate line PL, and a bit line BLs. The DRAM cell used in the present embodiment is capable of performing bit line operations shown in FIGS. 29A-29C. During standby, the bit line is precharged to a high-level voltage (Vint) of the bit line BL in FIG. 29A, to ½ Vint in FIG. 29B, and to Vss in FIG. 29C.

As shown in FIG. 29A, when the bit line BL is precharged to Vint, even if the word line WL is selected and the voltage is increased to 3.4 V, assuming that the high-level potential of the bit line BL is 1.8 V, the potential difference will be as low as 3.4 V-1.8 V=1.6 V. Accordingly, Vt of the cell transistor becomes high, and the cell charge is prevented from flowing to the bit line side due to the substrate bias effect. In the operation of FIG. 29B, when the threshold voltage of a p-channel and an n-channel sense amplification circuits is approximately 0.7-0.9 V, there will be no or only small difference from ½ Vint=0.9 V. Accordingly, as shown in the waveform of FIG. 29B, the sense amplification transistor is not easily turned on, and there will be no operation margin. When the bit line BL is precharged to Vss, as shown in FIG. 29C, the operation will be stable, without causing any of the above-described problems. Advantageous effects other than those described above are the same as those of the other embodiments.

The present embodiment adopts the operation method of FIG. 29C in principle. There is a case, however, where the speed of pre-charging to Vss becomes slow, under the effect of the resistance of the power source of Vss, in the operation of FIG. 29C. In this case, a transistor with a threshold voltage lower than the other threshold voltages should be applied to the sense amplification circuit in the method of FIG. 29B.

Sixteenth Embodiment

Figure 30:
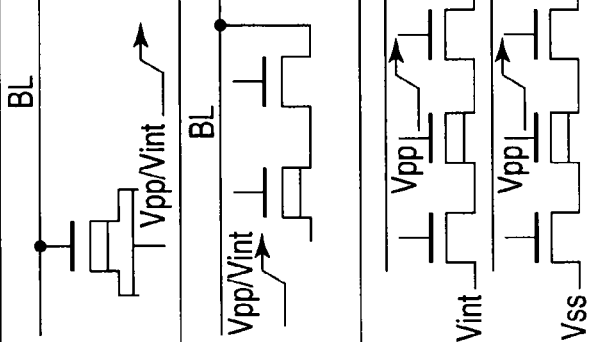
FIG. 30 illustrates a reference voltage generation circuit of a DRAM cell used in the sixteenth embodiment.

FIG. 30 illustrates a reference voltage generation circuit applicable to a DRAM cell combined with a NAND flash memory, according to the sixteenth embodiment.

In the above-described DRAM operation, since the plate potential is driven, the charge on the "0" data side is 0, but the charge on the "1" data side becomes as follows. That is, the capacitor is charged to high-level Vint of the bit line BL, and then the plate line is increased to Vpp. As a result thereof, the following relationship is satisfied: (charge on "1" side)=Cs×(Vpp+Vint)/(Cs+Cb), where Cs denotes a cell capacitor capacitance and Cb denotes a bit line capacitance.

As shown in FIG. 30, in the above-described configurations and operations of FIGS. 1-8, fluctuations of both Vint and Vpp effect the output signal. Further, when the difference between Vpp and Vint is small, the problem of drop in threshold voltage occurs, which also affects the threshold voltage of the cell (Vpp−Vint≤tcell). Further, it also affects variation in threshold voltage of the cell capacitor of a DRAM having a negative threshold value.

As a reference voltage generation circuit, the method of driving a simple Cap type shown in FIG. 30 also works, but the above-described effect of fluctuation of various kinds cannot be canceled. Further, in the case of Cap+Tr type, the capacitor needs to be precharged during standby at the voltage of Vint or Vpp. In this case, when Vint is applied, the fluctuation of Vpp cannot be canceled, and when Vpp is applied, on the other hand, the fluctuation of Vint cannot be canceled.

In 1+0 average type, two dummy cell capacitors, one of which is precharged to 0 V and the other is precharged to Vint, are prepared, a plate is increased to Vpp during read operation, and then the gate is opened and data is read to two referential bit lines. When the two referential bit lines are electrically short-circuited by a short-circuit Tr, a desired intermediate potential between "1" and "0" data is automatically generated, and fluctuations of Vint, Vpp and Vt can be canceled. In this case, however, the number of elements needs to be 3.5 transistors per bit line, which increases the circuit area.

Seventeenth Embodiment

Figure 31A:
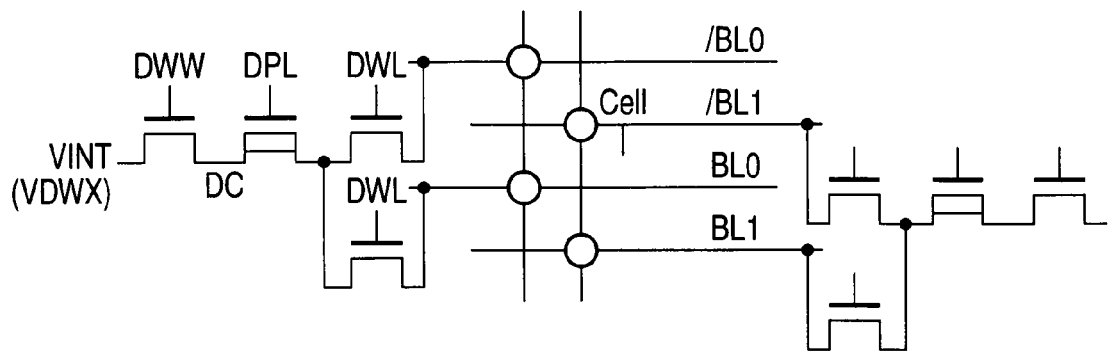
FIGS. 31A, 31B and 31C illustrate a reference voltage generation circuit of a DRAM cell used in the seventeenth embodiment.
Figure 31B:
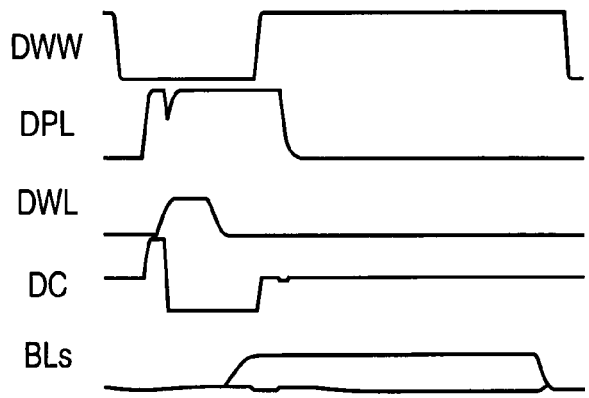
Figure 31C:
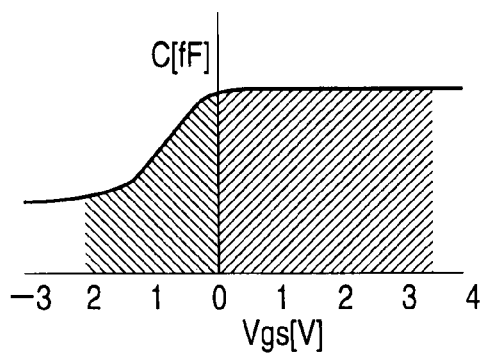

FIGS. 31A-31O illustrate a reference voltage generation circuit applicable to a DRAM cell combined with a NAND flash memory, according to the seventeenth embodiment. FIG. 31A is a circuit configuration diagram, and FIG. 31B is a timing chart. FIG. 31C shows the state of charge stored in a capacitor, in which the charge stored while the gate is negative is substantially increased by increasing the gate to Vpp.

The reference voltage generation circuit of the present embodiment adopts a method of reading half the potential of "1" data to a referential bit line. As shown in FIG. 31A, the reference voltage generation circuit is formed of a dummy capacitor and a write transistor, and a dummy cell transistor configured to connect the dummy capacitor and the write transistor to two referential bit lines, at the ratio of one to two reference bit lines. With this configuration, it is possible to form a dummy cell using four transistors per two referential bit lines, i.e., only two transistors per referential bit line.

In operation, as shown in FIG. 31B, during stand-by, a Vint voltage is written by setting a write control signal DWW to a high level. During operation, a DPL is increased to Vpp, a dummy word line DWL is set to a high level, and charge of the dummy capacitor is read to the two referential bit lines. After that, when the DWL is lowered, the charge obtained by halving the "1" data is read to the two referential bit lines.

In this method, it is possible to cancel the effect of fluctuation in Vint, Vpp, fluctuation in Vt of the cell transistor, and fluctuation in negative threshold voltage Vt of the cell capacitor. A problem of this embodiment exists in that the cell capacitor is shared by the two referential bit lines. Thereby, the potential of a size corresponding to ½ Cs of the referential cell capacitor is generated in the referential bit line, which becomes a factor of causing an error in the average between "1" and "0" data.

That is, while capacitor on "1" side=Cs×(Vpp+Vint)/(Cs+Cb) in a dummy capacitor, the charge read to one bit line BL becomes ½ Cs×(Vpp+Vint)/(½ Cs+Cb).

Figure 32:
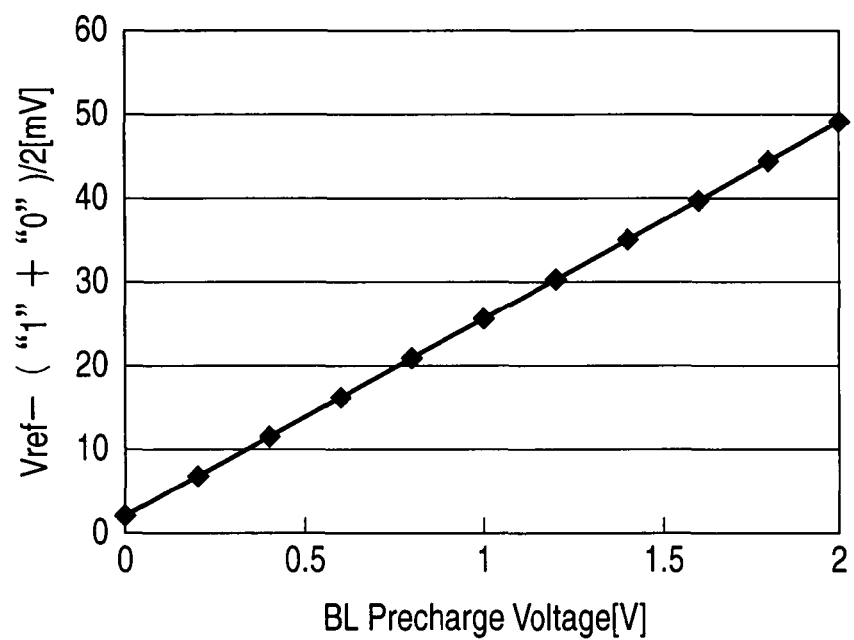
FIG. 32 illustrates a margin of error of a reference voltage used in the seventeenth embodiment.

FIG. 32 shows an error value of the reference voltage in the embodiment of FIGS. 31A-31C. The lateral axis indicates a precharge level of the bit line BL, and the vertical axis indicates the amount of error. In precharge of the bit line Vss as shown in FIG. 29C, the error is as small as 2 mV, and the circuit of FIG. 31A has a small area. The formula for the difference shows that the reference voltage difference between the average of "1"+"0", which is expressed as follows:

$$\{½Cs×(Vpp+Vint)+Cb×Vpre\}/(Cs+Cb),$$

and the average when Cs is ½ of "1", which is expressed as follows:

$$\{½Cs×(Vpp+Vint)+Cb×Vpre\}/(½Cs+Cb)$$

is expressed as follows:

$$\{¼Cs2×(Vpp+Vint)+½Cs×Cb×Vpre\}/(Cs+Cb)$$
$$∼¼(Cs/Cv)×(Vpp+Vint+½(Cs/Cb)×Vpre.$$

This is because when Cs is ½, the amount of charge stored until the potential of 0 V on the "0" data side reaches a precharge voltage of the bit line during reading is large, but when the precharge potential is 0 V, the error becomes as small as ½(Cs/Cb)×(Vpp+Vint), as shown in the formula. That is, the charge does not need to be stored.

Eighteenth Embodiment

Figure 33A:
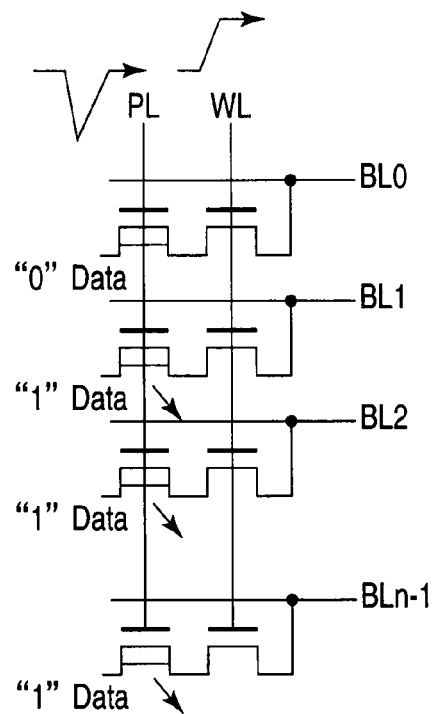
FIGS. 33A, 33B and 33C illustrate a method of driving a word line of the DRAM cell used in the eighteenth embodiment.
Figures 33B, 33C:
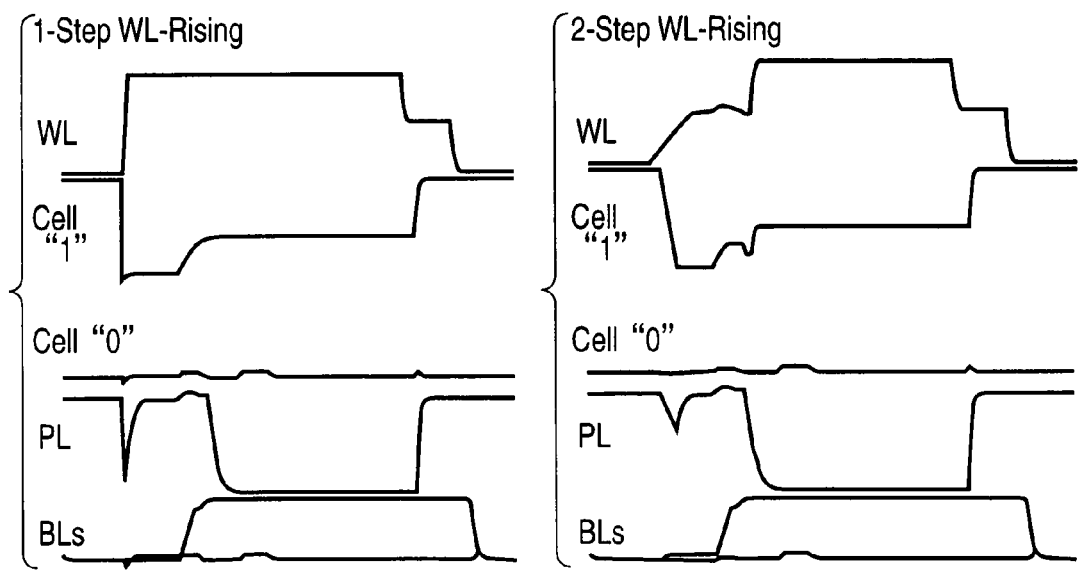

FIGS. 33A-33C illustrate a word line driving method of a DRAM cell combined with a NAND flash memory, according to the eighteenth embodiment. FIG. 33A shows a circuit configuration diagram, and FIGS. 33B and 33C are timing charts.

In the operation of FIG. 8A and the like, a problem occurs when "1" data is read in most of the selected cells and "0" data is read in some others. This is because the plate line PL is divided by the word lines WL and is resistive. That is, as shown in 1 Step WL-Rising of FIG. 33B, when the word line WL is set to a high level and the cell charge is read to the bit line, if "1" data is read in most of the cells, the cell node charge is read to the bit line BL and the cell node potential is lowered. Further, when the cell node potential is lowered, the plate line potential suddenly drops due to coupling of the cell capacitor. Thereby, the cell node of "0" data is to a negative value, which may cause the risk of data corruption.

In order to solve this problem, according to 2 Step WL-rising method of FIG. 33C, the potential of the word line WL is temporarily set to a low voltage at the point in time when the charge is read, and the resistance of the cell transistor is set to a relatively high value. This prevents a sudden outflow of the charge. After that, the potential of the word line WL is increased to a regular Vpp potential, and thereby the above-described problem is solved.

Nineteenth Embodiment

Figure 34A:
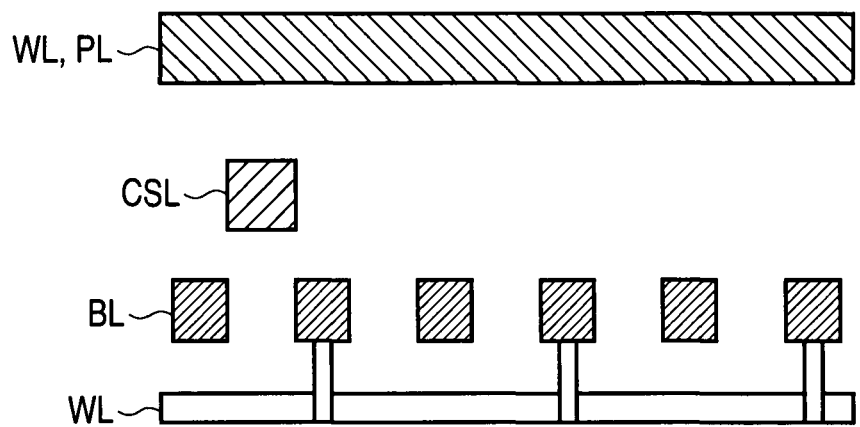
FIGS. 34A and 34B illustrate a method of arranging column selective lines used in the nineteenth embodiment.
Figure 34B:
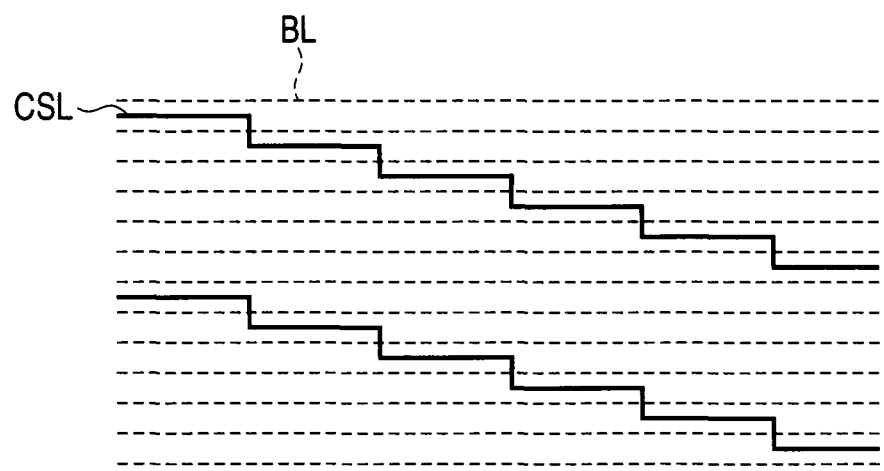

FIGS. 34A and 34B illustrate an arrangement of a column selective line, according to the nineteenth embodiment. FIG. 34A is a cross-sectional view and FIG. 34B is a plan view.

In the above-described embodiments, because of the small capacitance of the cell capacitor, the cell charge needs to be relatively small and the bit line capacitance needs to be minimized, no matter how much the cell node voltage is increased. In FIGS. 34A and 34B, the column selective line CSL is provided for every bit line BL, such that the parasitic capacitance between the column selective line CSL and the bit line BL is reduced. That is, a plurality of column selective lines CSL, each shared by a plurality of bit lines, are arranged in a zigzag pattern from one end to the other of the cell array, such that the column selective lines are equally arranged on the bit lines in distance. Thereby, the bit line capacitance is reduced, and a larger signal is secured.

Figure 35A:
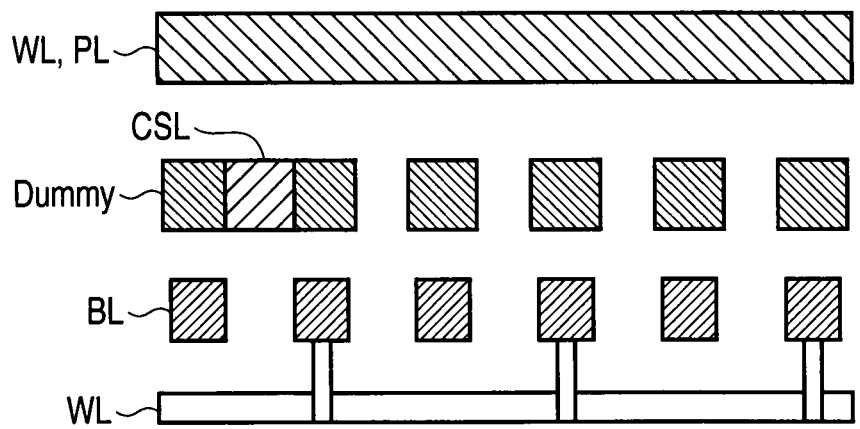
FIGS. 35A and 35B illustrate a method of arranging column selective lines in a DRAM cell according to the nineteenth embodiment.
Figure 35B:
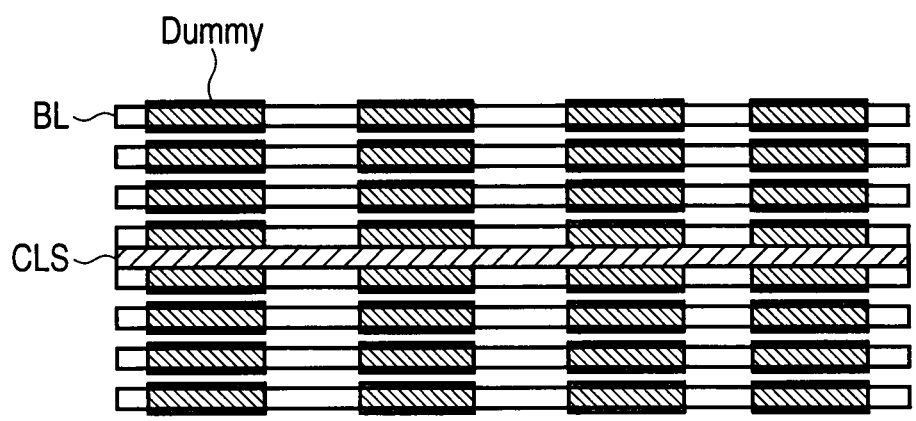

A configuration of the case where the wiring layer same as that of the column selective line CSL requires a certain dummy, due to the coverage, is shown in FIGS. 35A and 35B. FIG. 35A is a cross-sectional view, and FIG. 35B is a plan view. On a portion of the bit line BL where the column selective line CSL is not provided, a dummy metal is arranged at the pitch same as that of the bit line pitch. This reduces coupling via the bit line-dummy wiring-dummy wiring-bit line.

Twentieth Embodiment

Figure 36:
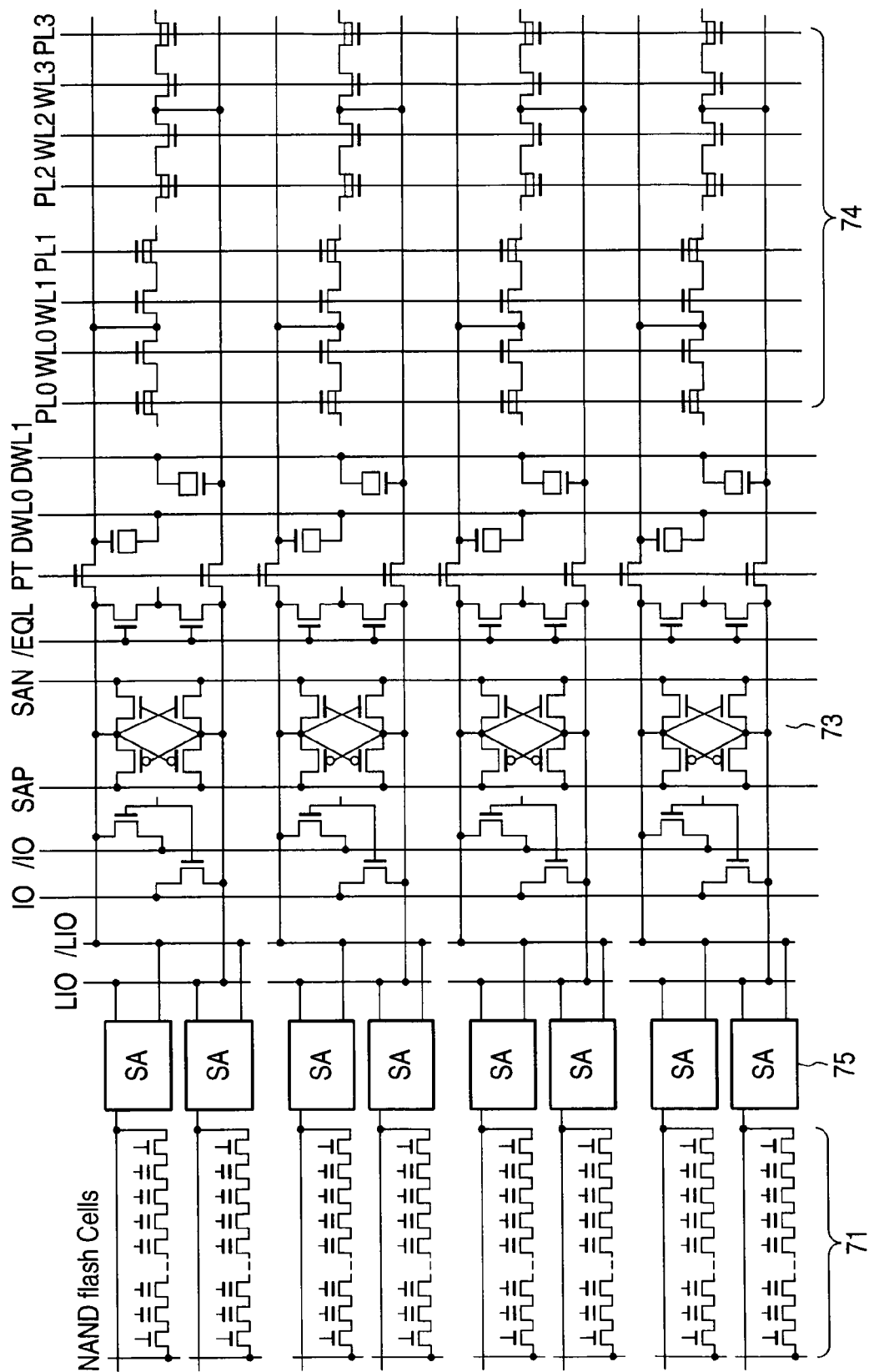
FIG. 36 is a circuit configuration diagram illustrating a configuration of main elements of a fusion memory according to the twentieth embodiment.

FIG. 36 illustrates a configuration of a sense amplification circuit connected to a cell array of a NAND flash memory and a DRAM array connected thereto, according to the twentieth embodiment.

The present embodiment adopts a basic configuration similar to that of FIG. 25, but uses a sense amplifier 75 instead of the page buffer 72.

Data is transferred to a latch connected to a SAP and a BSAN of a DRAM cell portion via IO, /IO from outside the chip, and the data is written to the DRAM cell 74 via a selected word line of the DRAM cell portion. When the written data is written to a NAND flash memory 71, a WL is selected, and the data is amplified and read to a latch circuit connected to the SAP, BSAN. Each DRAM circuit is arranged at the ratio of one to a certain number of BL of the NAND, and is transferred to one of a plurality of latches/sense amplification circuits of the NAND array via the divided LIO, /LIO with respect to one latch circuit of the DRAM cell portion. When the plurality of data items are repeatedly read by selecting another WL of the DRAM cell portion, the DRAM data is transferred to the sense amplification circuits of all the NANDs.

In this way, one DRAM sense amplification circuit is connected to a sense circuit of a plurality of (N number of) NANDs, such that each cell of the word lines of the plurality of (N number of) DRAMs connected to the DRAM sense amplification circuit is transferred to a sense amplification circuit of the plurality of NANDs. Thereby, a NAND flash can be provided using one-bit sense amplifier/latch circuit, at the minimum, on the NAND side. Further, the plurality of items of data can be transferred in parallel in each combination, and the data transfer rate inside the chip is greatly improved.

Twenty First Embodiment

Figure 37:
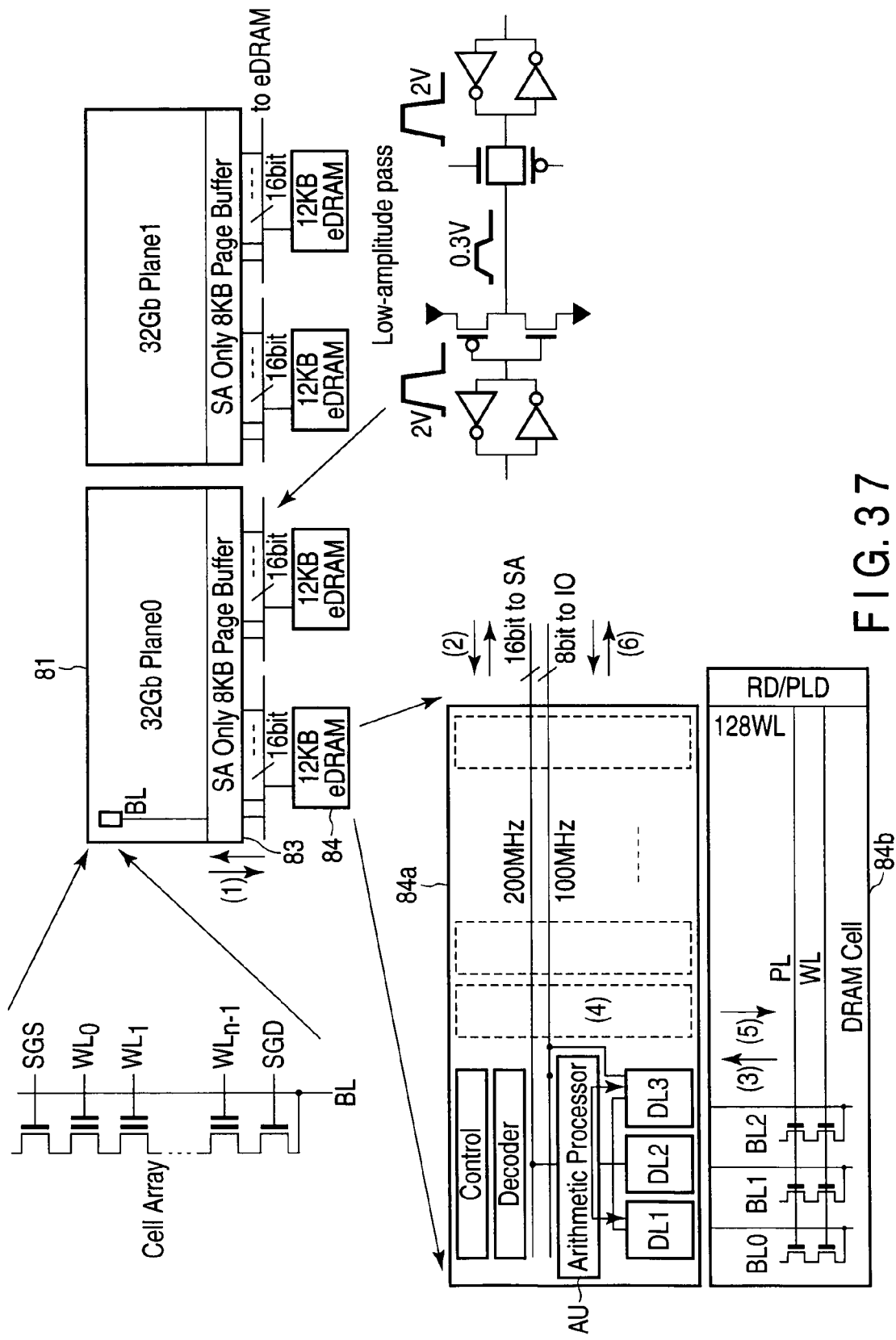
FIG. 37 illustrates a configuration of a fusion memory according to the twenty first embodiment.

FIG. 37 illustrates a fusion memory according to the twenty first embodiment, and shows a configuration of a sense amplification circuit connected to a cell array of a NAND flash memory and an eDRAM (fusion DRAM) connected thereto. The reference numeral 81 denotes a NAND flash memory, the reference numeral 83 denotes a sense amplifier (SA), and the reference numeral 84 denotes an eDRAM. Further, the reference numeral 84a denotes a control portion of the eDRAM 84, and the reference numeral 84b denotes a cell portion of the eDRAM 84.

The cell portion 84b of the eDRAM 84 may have substantially the same configuration as that of the NAND flash memory, as in the first to fifth embodiments, or may be a usual cell configuration. When it has substantially the same configuration as that of the NAND flash memory, advantageous effects same as those of the first to fifth embodiment are obtained.

In the conventional NAND flash memory, data read from and written to the NAND cell string has been processed by a page buffer provided at the end of the cell array. In this embodiment, only the sense amplifier SA83 including one-bit latch circuit, configured to store a circuit for the conventional sense operation and write operation and store read and write information, is provided at the cell array end of the NAND flash memory 81.

Usually, a NAND flash memory stores N-bit information in a selected memory cell and reads N-bit information. In the present embodiment, such bit information items are stored in a plurality of eDRAMs 84, separately arranged in the vicinity of the SA 83 at the memory cell end of the NAND flash memory 81. The eDRAM 84 writes the read/write information, after being subjected to a logic operation process, to the cell portion 84b. When necessary, such information is read again from the cell portion 84b, and is stored in latch circuits DL1-DL3 shared with sense circuits of the eDRAMs. A plurality of bits are prepared for the latch circuits DL1-DL3, with respect to one-bit sense amplification circuit 83 on the NAND side. A logic operation circuit AU, configured to implement a logic operation on data of the latch circuits DL1-DL3 and data of the latch circuit (SA) 83 of the NAND, is provided. Further, the result of the operation is returned to one of the latch circuits DL1-DL3 and the latch circuit on the NAND side.

In this example, 4 eDRAMs 84 are arranged so as to operate in parallel, and a bus connecting the NAND flash memory 81 and the DRAM 84 also operates in parallel. For example, when the result obtained by implementing an XOR logic operation on the data of the latch circuit read from the NAND flash memory 81 and the latch DL1 of the eDRAM 84, is returned to the latch of DL1, the latch circuit (SA) 83 is sense-amplified from the NAND flash memory 81 and latched. After that, in order to process part of the address of the latch circuit (SA) 83, a word line WL of the eDRAM 84 is selected, and information stored in the cell portion 84b is read to DL1, DL2 and DL3.

In this case, information corresponding to all the columns of the eDRAM 84 that is to be subjected to an operation with DL1, DL2, DL3 is sequentially transferred in BUS time division between the NAND flash memory 81 and the eDRAM 84 from the latch circuit (SA) 83 on the NAND side to the logic operation circuit AU of the DRAM 84. When data corresponding to all the columns has been transferred, or every time transfer is made, data from the NAND flash memory 81 and data of DL1 are fetched into the AU and subjected to a logic operation process, and then returned to DL1. For this execution, the AU may include a latch configured to temporarily record the data from the NAND flash memory 81, or a latch configured to temporarily store the operation result.

When the operation ends, the results of DL1-DL3 are written back to the cell portion 84b of the eDRAM 84 again. After that, a different word line WL is selected, the cell data is transferred to the latches DL1-DL3 and is subjected to a logic operation with data on an adjacent latch circuit (SA) 83 on the NAND side. The result is fetched into DL1, and then returned to the DRAM cell portion 84b.

All the computing operations on information on all the latch circuits of the NAND flash memory 81 are executed in time division. Thereby, the page buffer of the NAND flash memory 81 can be formed only of the minimum sense, write, and latch circuits. Other logic operation processes and latch circuits can be provided on the eDRAM 84. Since a majority of latch information that has conventionally been stored in a DRAM cell is stored in a DRAM cell, the chip area can be greatly reduced. By performing a logic operation process and its control in time division, the circuit area is reduced, and thereby the chip area is greatly reduced.

A problem exists that the amount of communication between the latch circuit of the NAND flash memory 81 and the eDRAM84 of the present embodiment greatly increases compared to the amount of communication between the conventional page buffer and the exterior, but this problem can be solved as follows:

(a) Delay in operation is minimized by performing transfer and computing operation during programming and reading to the NAND flash memory 81; and (b) The distance between the latch circuit of the NAND flash memory 81 and the eDRAM84 is divided by dividing the eDRAM84 into a plurality of portions in a chip, and thereby the charge/discharge current is reduced.

Further, as shown in FIG. 37, when data is transferred at a small amplitude of less than or equal to 0.5 V, such as 0.3 V, the power consumption can be reduced. In order to transfer data at a small amplitude, two differential data items may be transferred. By operating the eDRAM 84 divided into a plurality of portions and a BUS simultaneously, the transfer time is greatly reduced.

In FIG. 37, (1) indicates transfer between a NAND and a latch circuit, (2) indicates transfer between a latch circuit (SA) 83 and the eDRAM84, (3) and (5) indicate transfer between a cell of the DRAM and a sense amplifier/data latch circuit, (4) denotes an operation of performing an arbitrary operation from DL1-DL3 and the latch circuit 83 on the NAND side, and returning the obtained result to the latch circuit 83 on the NAND side or to DL1-DL3. Further, (6) indicates a transfer operation of reading the final read data to outside the chip and fetching the written data from outside.

Thus, according to the present embodiment, a page buffer of the NAND flash memory 81 is configured as a sense amplifier 83 including one-bit latch, the eDRAM 84 divided into a plurality of portions is connected to the sense amplifier 83, and the operation circuit and its control are performed in time division. Thereby, the chip size is reduced and thereby the manufacturing cost is reduced, while minimizing the power consumption and delay in time.

Twenty Second Embodiment

Figure 38:
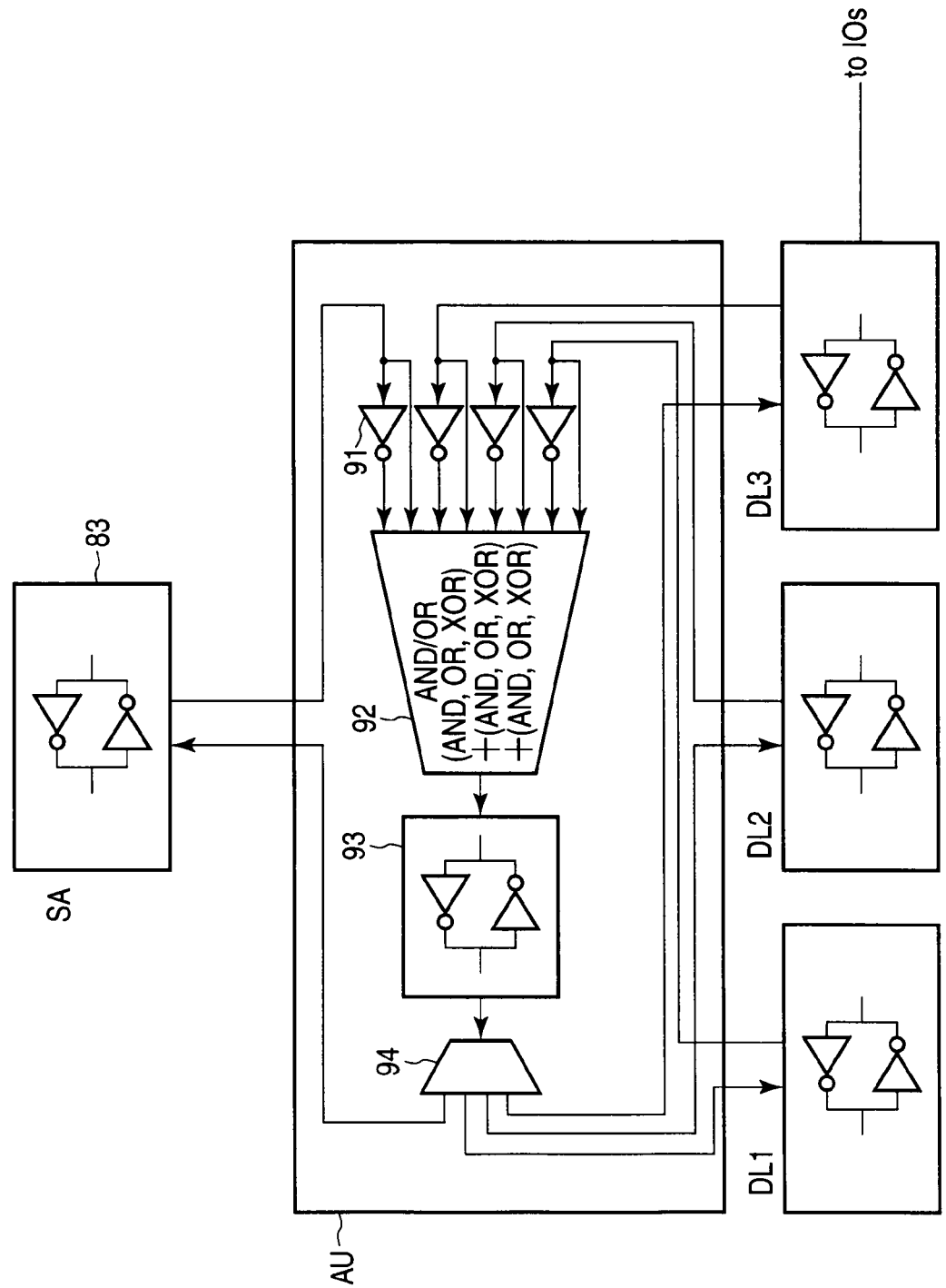
FIG. 38 illustrates a latch circuit and a logic operation circuit of a sense amplifier portion of a DRAM portion used in the twenty second embodiment.

FIG. 38 illustrates a configuration of an AU portion of an eDRAM, according to a fusion memory of the twenty second embodiment.

The AU portion includes a circuit 91 configured to invert information from each of latch circuits DL1-DL3 that are also used as sense lathes of an eDRAM 84 and information from the latch circuit (SA) 83 of a NAND flash memory 81, a logic circuit 92 configured to implement a logic operation (AND/OR) on a signal inverted and input by the circuit 91, a latch circuit 93 configured to latch the operation result of the logic circuit 92, and a demultiplexer 94 configured to return the latched result to one of the SA, DL1, DL2, and DL3. There may also be provided a circuit configured to latch information from the SA 83 for a while.

The logic operation implemented in the logic circuit 92 includes PASS, NOT, AND, NAND, OR, NOR, XNOR, XOR, and the like, and OR of the results thereof. A function of selecting an operation logic is provided for each operation.

The number of DLs is 3 in this example, based on the assumption of 2 bits/cell, but may be increased in the case of 3 bits/cell or 4 bits/cell. The number of DLs should be reduced in the case of 2 bits/cell.

The operation of the present embodiment is the same as that of FIG. 37. Accordingly, advantageous effects same as those of the twenty first embodiment will be obtained.

Twenty Third Embodiment

Figure 39:
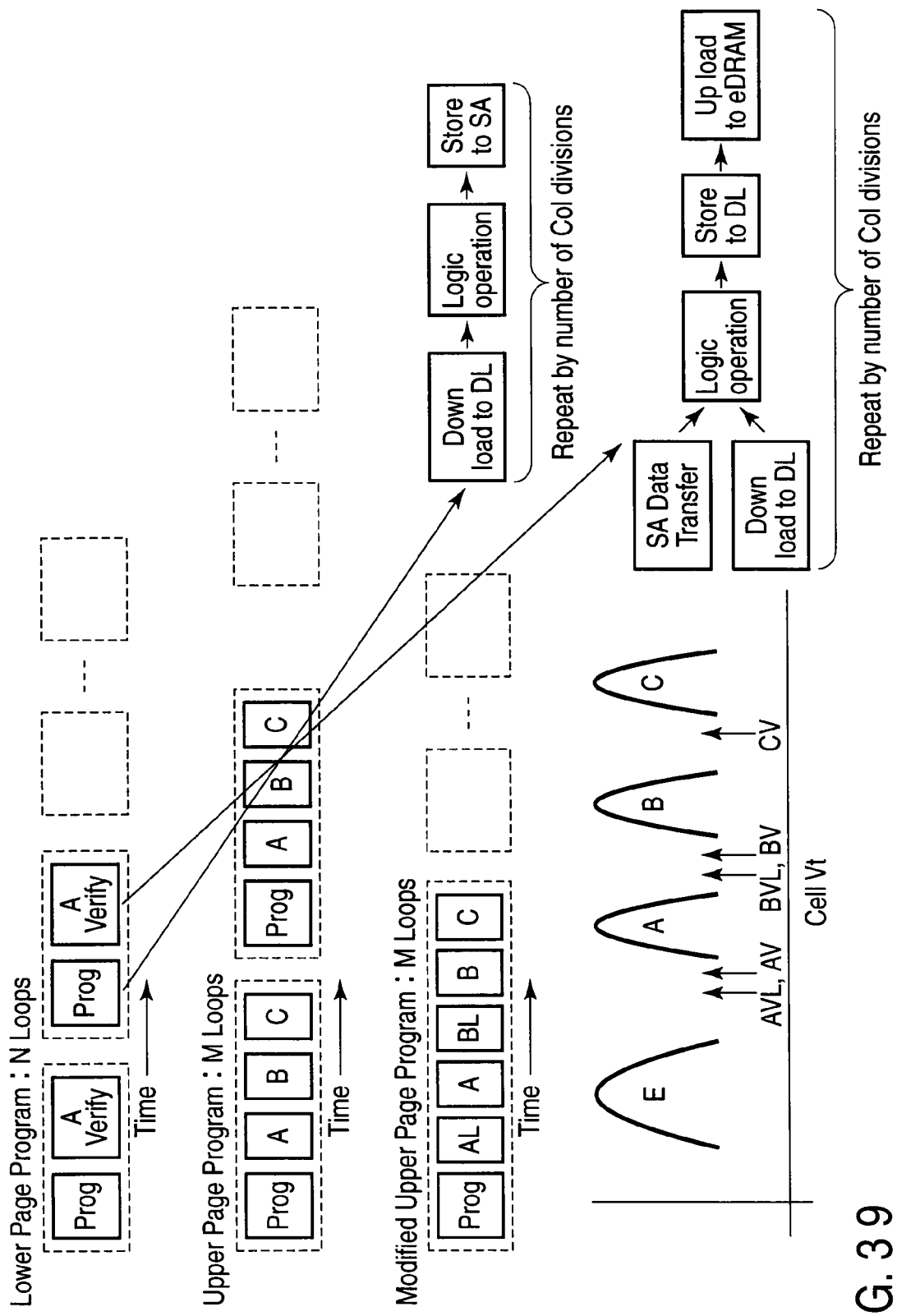
FIG. 39 illustrates a program operation example of a fusion memory according to the twenty third embodiment.

FIG. 39 is a schematic view showing a memory program operation example of a fusion memory according to the twenty third embodiment.

In a NAND flash memory, multi-valued information of 1 to 4 bits is usually stored in one cell. This example shows a two-bit case. First, a lower page program operation of the lower bit is performed. The program speed of each cell varies due to miniaturization of the NAND cell. Usually, a program operation is performed first, and then a verify read operation is performed so as to verify whether the programmed threshold value has reached a desired value. Due to variation of the cells, this operation is repeated for every bit line, i.e., every cell, a number of times (N times in this example) until the desired threshold voltage is achieved. The operation is performed 3 times for the cell A and 6 times for the cell B, for example. Thereby, one-bit information (indicating whether the level is an erase level or a program level) is stored.

Next, in order to store one more bit, an upper page program operation of the upper bit is performed. A program operation is performed first, and then a verify-read operation is performed so as to verify whether the programmed threshold value has reached a desired value. This operation is performed for each bit line, i.e., for each cell, a number of times (M times in this example) until a desired threshold voltage is achieved. Through these operations, 4 types (erase level, A level, B level, and C level) of distributions are achieved, as shown in the cell threshold voltage distribution shown in the lower part of FIG. 39, and thereby two-bit information can be written to one cell.

In the present embodiment, DRAM data is read to latch circuits of DL1-DL3, and data to be transferred to a latch circuit of a NAND is synthesized in logic operation and transmitted to the latch circuit of the NAND, for every program operation. The BL potential is varied based on this, and it is determined whether to perform a program operation (set BL to a low level) or a program-inhibit operation (set BL to a high level).

That is, the logic operation is determined by implementing a logic operation based on a desired program level and a verified result of the last loop. When the operation has ended, the DL data is written back to the DRAM cell again. Similar operations are repeated by the number of columns of the latch circuit of the NAND by selecting a different WL, since only part of the latch circuit of the NAND is processed in one WL select operation of the DRAM. Similarly, in the present embodiment, the verified result input to the latch circuit of the NAND and the result read to the latch circuit of DL1-DL3 from the DRAM data are processed in the logic operation circuit, and the result thereof is returned to one of DL1-DL3. The verified result of the A-C levels is used to play back precise bit information, or used as data of the next loop.

As another NAND programming approach, there is an approach of slowing down the program speed by slightly increasing the bit line potential of the program when Vt of the cell approximates the reference, so as to make the distribution tighter. The modified upper page program operation shown in FIG. 39 is such an approach.

A verify-read operation is performed on a portion of A level (AV) and B level (BV) where Vt is slightly low, with reference to AVL and BVL (i.e., the level of the WL is slightly lowered during read operation), and a BL level is slightly increased and programmed in a cell that has reached the Vt level. In this operation, too, a logic operation is performed based on latch information of the NAND and the original DL information, apart from bit information, and information on the next loop operation is latched in the DL and then written to the DRAM cell. This is performed by selecting a plurality of WLs of the DRAM by the number corresponding to the NAND latches.

Twenty Fourth Embodiment

Figure 40:
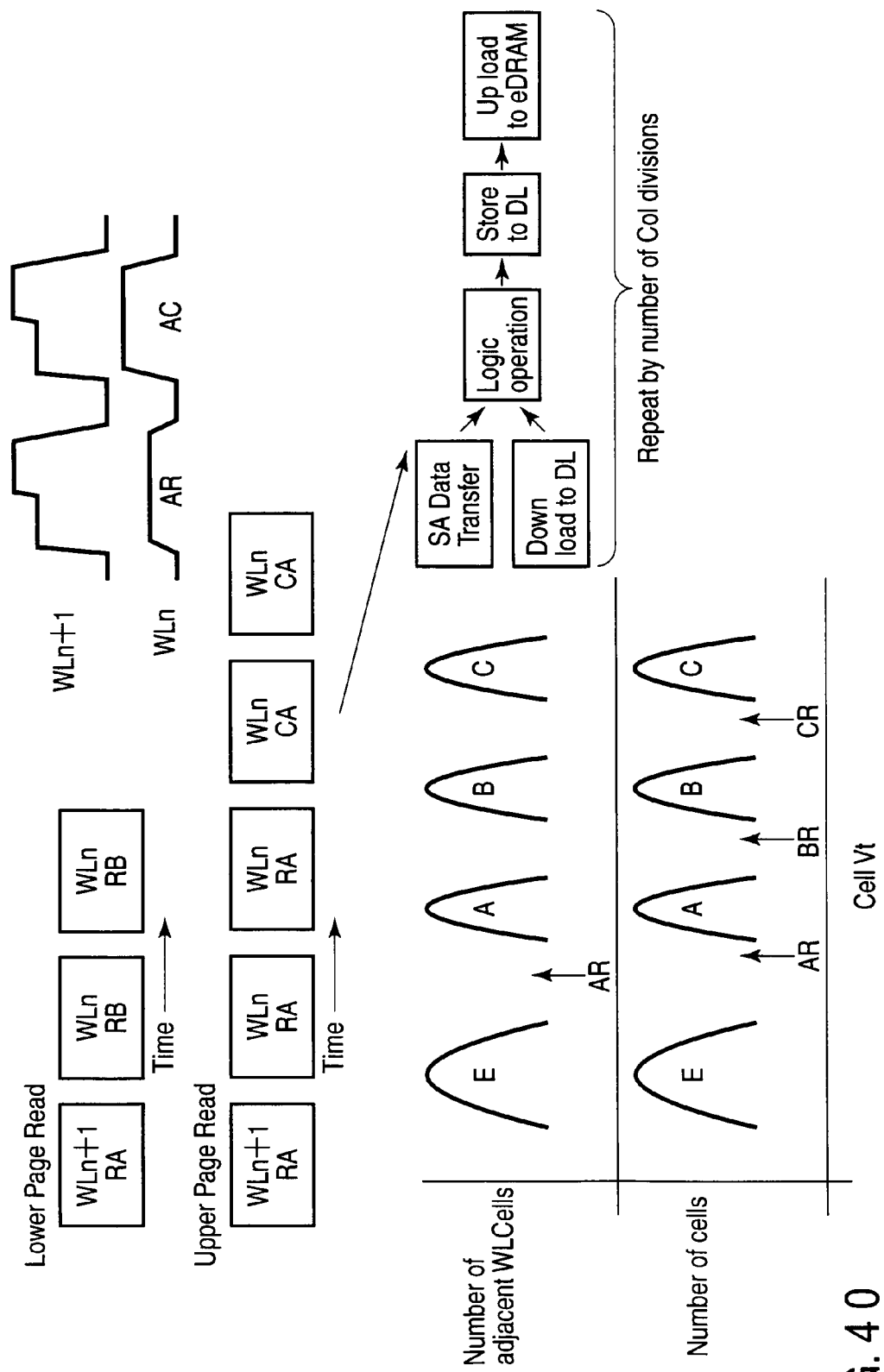
FIG. 40 illustrates a program operation example of a fusion memory according to the twenty fourth embodiment.

FIG. 40 is a schematic view illustrating an example of memory read operation of a fusion memory according to the twenty fourth embodiment.

In a usual read operation, the level of the WL of a selective cell is increased to a voltage at which the referential A level, B level, and C level can be judged. When Vt is greater than the referemtial voltage, the BL is set to the precharged VINT level, and when Vt is lower than the reference voltage, the cell Tr is turned on and the BL level is lowered. This is judged by a sense amplification circuit attached to a latch circuit of the NAND. Each of the results of A, B, and C is subjected to an operation with DL information read from the DRAM cell to the latch circuit, written back to one of the latch circuits of the original DL, and is returned to the DRAM cell again. This operation is repeated by the number corresponding to the number of latch circuits of the NAND. That is, the DRAM is operated by selecting a different WL, only the necessary number of WL is read to the DL, subjected to an operation, and written. This is because, during read operation, the judged results of A, B, and C vary in time axis and need to be temporarily stored in a DL latch, and precise two-bit information needs to be fetched by an operation process based on the results of A, B, and C.

The example of FIG. 40 further shows a read operation example of the present embodiment in an operation of correcting variation of Vt of a selected cell due to Vt of the adjacent floating gate under the effect of coupling of the adjacent floating gate and the selective floating gate.

First, it is judged whether the previous WLn+1 is at an erase level or at higher levels, i.e., A, B, C levels. This result by the NAND latch circuit and the original data read from the DRAM cell to the latch circuit are subjected to a logic operation and written to the DL again, and then returned to DRAM cell data. This is repeated by the number of NAND latches.

Next, when the cell data of the originally selected WL is read, a read operation is performed at the level of WLn corresponding to the A, B, C levels of the original cell, while the adjacent word line WLn+1 is varied in two kinds. The result of the NAND latch circuit and the original data read from the DRAM cell to the latch circuit are subjected to a logic operation and written to the DL again, and then returned to the DRAM cell data. This is repeated by the number of NAND latches.

In this way, by implementing an operation based on the result of WLn+1 and the result of WLn, the corrected data is extracted and the precise bit information is reconstructed. It is thereby possible to correct variation of Vt of the selected cell due to Vt of the adjacent floating gate.

Modification Example

The present invention is not limited to the above-described embodiments. The configuration of the non-volatile memory cell forming the NAND flash memory is not limited to the configuration shown in FIG. 2A, and a charge storage layer may be used instead of the floating gate. When a charge storage layer is used, the configuration of the selective transistor needs to be changed to a configuration of a usual single-layer gate transistor. In that case, the cell transistor and the MOS capacitor of the DRAM cell should have the same configuration as that of the selective transistor.

Further, the cell transistor and the MOS capacitor forming the DRAM cell only need to have a configuration substantially the same as that of the selective transistor forming a NAND flash memory, and the size of the gate electrode of the cell transistor and the MOS capacitor may be varied as appropriate, according to specification. Moreover, the number of the DRAM cell with respect to the NAND flash memory may be varied as appropriate according to specifications.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory, comprising:
a semiconductor substrate;
a first memory cell array formed on the semiconductor substrate by arranging a plurality of NAND cell units,
the NAND cell unit of the first memory cell array comprising a non-volatile memory cell including a first transistor and a first and a second selective transistor each including a second transistor, the first transistor having a stacked structure in which a first insulation film, a first gate film, a second insulation film, and a second gate film are stacked on the substrate, and having a two-layer gate structure in which a source region and a drain region are formed on both sides interposing a channel region below the first insulation film, the second transistor having a structure same as the structure of the first transistor except for having a two-layer gate structure in which an opening is provided in the second insulation film and the first gate film and the second gate film are electrically connected,
the non-volatile memory cells being connected in series in a source/drain direction and the first and second selective transistors are connected to first and second ends respectively of a serial connection portion connecting the non-volatile memory cells in series; and
a second memory cell array formed by arranging a plurality of DRAM cells on the substrate,
the DRAM cell of the second memory cell array comprising a cell transistor and a first MOS capacitor, the cell transistor including a third transistor having a structure same as the structure of the second transistor, the first MOS capacitor having a stacked structure same as the structure of the first or second transistor and including a source-corresponding region and a drain-corresponding region, the first gate film being connected to a plate line in the first MOS capacitor,
the source-corresponding region of the MOS capacitor is connected to the source region of the cell transistor.

2. The semiconductor memory according to claim 1, wherein a threshold voltage of the MOS capacitor is set to a negative value lower than −3 V.

3. The semiconductor memory according to claim 1, wherein the plate line is set to a voltage higher than a potential on "H" level side of a bit line operation during standby, lowered to 0 V during access to the DRAM cell, and then returned to the potential during standby so as to write data.

4. The semiconductor memory according to claim 3, wherein a source potential of the cell transistor storing the "H" level is set to a value higher than the potential during standby of the plate line.

5. The semiconductor memory according to claim 1, wherein a gate width in a direction crossing the source/drain direction of the MOS capacitor is wider than a gate width of the cell transistor.

6. A semiconductor memory, comprising:
a semiconductor substrate; and
a first memory cell array formed on the semiconductor substrate by arranging a plurality of first NAND cell units,
the first NAND cell unit of the first memory cell array comprising a non-volatile memory cell including a first transistor and a first and a second selective transistor each including a second transistor, the first transistor having a stacked structure in which a first insulation film, a first gate film, a second insulation film, and a second gate film are stacked on the substrate, and having a two-layer gate structure in which a source region and a drain region are formed on both sides interposing a channel region below the first insulation film, the second transistor having a structure same as the structure of the first transistor except for having a two-layer gate structure in which an opening is provided in the second insulation film and the first gate film and the second gate film are electrically connected,
the non-volatile memory cells being connected in series in a source/drain direction and the first and second selective transistors are connected to first and second ends respectively of a serial connection portion connecting the non-volatile memory cells in series, wherein
a second memory cell array formed by arranging a plurality of second NAND cell units on the semiconductor substrate,
the second NAND cell unit of the second memory cell array comprising a plurality of third transistors on the substrate and a fourth and fifth transistor at first and second ends respectively of a serial connection portion connecting the third transistors in serial, the third transistor having a structure same as the structure of the first transistor, the fourth transistor having a structure same as the structure of the second transistor, wherein
the first memory cell array functions as a non-volatile memory configured to store information depending on variation in threshold voltage by variation in amount of electrons injected and released into and from the first gate film, and
the second memory cell array functions as a volatile memory configured to store information depending on variation in potential by variation in charge stored in an inner channel node of the second NAND cell unit.

7. The semiconductor memory according to claim 1, wherein the second memory cell array has a capacitance double a capacitance at which the NAND cell units in the first memory cell array can be programmed at once.

8. The semiconductor memory according to claim 1, wherein the first gate film of the first transistor is connected to a first word line, one end of the NAND cell unit is connected to the first bit line, the other end is connected to a source line, the first gate film of the third transistor is connected to the second word line, and the drain region is connected to the second bit line.

9. The semiconductor memory according to claim 8, wherein the second word line is set to a first potential during standby, set to a second potential higher than the first potential during a select operation, increased to a third potential higher than the second potential, lowered to the second potential, and then lowered to the first potential.

10. The semiconductor memory according to claim 9, wherein the potential of the second word line is increased to the third potential after cell data is read to the second bit line and amplification of the second bit line potential is started by a sense amplification circuit.

11. The semiconductor memory according to claim 8, further comprising:
a second MOS capacitor including a layer structure same as the layer structure of the first or second transistor and a source-corresponding region and a drain-corresponding region, the first gate film being connected to a dummy plate line; and
two fifth transistors each including a gate connected to the dummy word line, wherein a referential bit line potential generation circuit is formed of the second MOS capacitor and the fourth and fifth transistors.

12. The semiconductor memory according to claim 11, wherein the write control signal is lowered from a high level to a low level during operation of the second memory cell array, the dummy plate line and the dummy word line shift from the low level to the high level, the dummy word line is lowered to the low level, and then the write control signal is set to the high level and the dummy plate line is lowered to the low level.

13. The semiconductor memory according to claim 8, further comprising a dummy cell having a layer structure same as the layer structure of the first or second transistor and including a second MOS capacitor configured to store a potential of "1" data and a circuit configured to divide a charge of the "1" data stored in the second MOS capacitor in half and supply the halved capacitance to the two referential bit lines.

14. The semiconductor memory according to claim 8, further comprising a dummy cell circuit including a second MOS capacitor configured to store a potential of "0" data, a third MOS capacitor having a stacked structure same as the structure of the first or second transistor and configured to store a potential of "1" data, and a circuit configured to average the "1" data and the "0" data stored in the second and third MOS capacitors and supply the average to the referential bit line.

15. The semiconductor memory according to claim 8, further comprising:
a sense amplification circuit connected to the second memory cell array end;
a column selection circuit configured to read data amplified by a sense amplification circuit of a specific column to outside; and
a plurality of column selective lines configured to control the column selection circuit, wherein the column selective line is provided in a meander shape on the second memory cell array for every pair of second bit lines such that parasitic capacitance between the column selective line and the pair of second bit lines becomes equal.

16. The semiconductor memory according to claim 8, wherein the first bit line is connected to a first sense amplification circuit at an end of the first memory array, and the second bit line is connected to a second sense amplification circuit at an end of the second memory cell array, the fusion memory further comprising:
- a circuit configured to connect one of the first sense amplification circuits to the second sense amplification circuit for every first sense amplification circuit.

17. The semiconductor memory according to claim 16, wherein data transfer based on a combination of the first sense amplification circuits and the second sense amplification circuit is performed in parallel in the combination.

18. The semiconductor memory according to claim 8, wherein the first bit line of the first memory cell array is connected to a first latch circuit configured to read data from the first bit line and store information used to write data to the first bit line, and the second bit line of the second memory cell array is connected to a second latch circuit configured to read data from the second bit line and store information used to write data to the second bit line, the fusion memory further comprising:
- a logic operation circuit and a controller for every second latch circuit, the logic operation circuit implementing a logic operation using information of the second latch circuit and information of the first latch circuit as an input; and
- a controller configured to return a result of the logic operation of the logic operation circuit to one of the second latch circuits or the first latch circuit.

19. A semiconductor memory, comprising:
- a first memory cell array configured to store information by injecting an electron into a floating gate; and
- a second memory cell array configured to store information by storing an electron in a capacitor, the second memory cell array being formed on the same semiconductor substrate as the first memory cell array, wherein
- a first bit line of the first memory cell array is connected to a first latch circuit configured to read data from the first bit line and store information used to write data via the first bit line, and a second bit line of the second memory cell array is connected to a second latch circuit configured to read data via the second bit line and store information used to write data via the second bit line, the semiconductor memory further comprising:
- a logic operation circuit for every second latch circuit, the logic operation circuit implementing a logic operation using information of the second latch circuit and information of the first latch circuit as an input; and
- a controller configured to return a result of the logic operation of the logic operation circuit to one of the second latch circuit or the first latch circuit.

20. The semiconductor memory according to claim 18, wherein the number of second latch circuits is smaller than the number of the first latch circuits,
- information on the first latch circuit with a different address is subjected to a logic operation with information read from the second memory cell array to the second latch circuit by selecting the second word line of the second memory cell array in time division.

21. The semiconductor memory according to claim 18, wherein a plurality of second memory cell arrays are provided and are operated simultaneously.

22. The semiconductor memory according to claim 18, wherein a plurality of second memory cell arrays are provided and are operated at shifted driving times.

23. The semiconductor memory according to claim 18, wherein information on the first latch circuits is transferred to the logic operation circuits in time division.

24. The semiconductor memory according to claim 18, wherein the logic operation circuit includes a latch circuit configured to store a result of the logic operation.

25. The semiconductor memory according to claim 18, wherein data transfer between the first latch circuit and the logic operation circuit is performed at a small amplitude of greater than or equal to 0.5 V.

26. The semiconductor memory according to claim 18, wherein data transfer between the first latch circuit and the logic operation circuit is differential transfer via two signal lines.

* * * * *